(12) United States Patent
Schneider et al.

(10) Patent No.: US 11,237,090 B2
(45) Date of Patent: Feb. 1, 2022

(54) SENSOR ELEMENT, PARTICLE SENSOR DEVICE AND METHOD FOR DETECTING A PARTICULATE MATTER DENSITY

(71) Applicant: Infineon Technologies AG, Neubiberg (DE)

(72) Inventors: Michael Schneider, Vienna (AT); Alfons Dehe, Villingen Schwenningen (DE); Manuel Dorfmeister, Vienna (AT); Christoph Glacer, Munich (DE); Ulrich Krumbein, Rosenheim (DE); Ulrich Schmid, Vienna (AT); David Tumpold, Kirchheim b München (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 23 days.

(21) Appl. No.: 16/807,698

(22) Filed: Mar. 3, 2020

(65) Prior Publication Data
US 2020/0309665 A1 Oct. 1, 2020

(30) Foreign Application Priority Data
Mar. 26, 2019 (EP) ..................................... 19165334

(51) Int. Cl.
*G01N 15/06* (2006.01)
(52) U.S. Cl.
CPC ................................ *G01N 15/0606* (2013.01)
(58) Field of Classification Search
CPC ........... G01N 15/0606; G01N 15/0656; G01N 15/0637; G01N 15/02; G01N 29/022; G01N 29/036; G01N 29/2437; G01N 2291/042; G01N 2291/02809; G01N 2015/0046;
(Continued)

(56) References Cited

U.S. PATENT DOCUMENTS

| 2,439,499 | A | * | 4/1948 | Williams | ............... | H02N 2/105 |
| | | | | | | 310/331 |
| 2,926,522 | A | * | 3/1960 | Kritz | ...................... | G01N 29/02 |
| | | | | | | 73/32 R |

(Continued)

FOREIGN PATENT DOCUMENTS

DE 102017213765 A1 2/2019

OTHER PUBLICATIONS

Toth, Florian et al., "Non-Linear Analysis of a Pre-Stressed Piezo-electric Multi-Layer Plate", VIII ECCOMAS Thematic Conference on Smart Structures and Materials, SMART, Jun. 8, 2017, 10 pages.

*Primary Examiner* — David J Bolduc
(74) *Attorney, Agent, or Firm* — Slater Matsil, LLP

(57) ABSTRACT

A sensor element includes a membrane structure suspended on a frame structure, wherein the membrane structure includes a membrane element and an actuator. The membrane structure is deflectable in a first stable deflection state and in a second stable deflection state and is operable in a resonance mode in at least one of the first and the second stable deflection states. The actuator is configured to deflect the membrane structure in a first actuation state into one of the first and the second stable deflection states, and to operate the membrane structure in a second actuation state in a resonance mode having an associated resonance frequency.

20 Claims, 11 Drawing Sheets

(58) Field of Classification Search
CPC ........ B81C 1/00182; B81B 2201/0285; B81B 2203/0127
See application file for complete search history.

(56) References Cited

U.S. PATENT DOCUMENTS

| | | | | |
|---|---|---|---|---|
| 2,943,278 | A * | 6/1960 | Mattiat | H03H 9/566 333/32 |
| 4,193,010 | A * | 3/1980 | Kompanek | G01F 23/2967 310/321 |
| 4,868,446 | A * | 9/1989 | Kumada | H02N 2/002 310/323.02 |
| 5,524,477 | A * | 6/1996 | Wajid | G01N 29/036 73/24.01 |
| 5,814,922 | A * | 9/1998 | Uchino | H01L 41/107 310/359 |
| 6,040,654 | A * | 3/2000 | Le Letty | H01L 41/107 310/358 |
| 6,096,559 | A * | 8/2000 | Thundat | G01N 29/036 422/51 |
| 6,222,366 | B1 * | 4/2001 | Dilger | G01G 3/13 324/300 |
| 6,304,021 | B1 * | 10/2001 | Wolf | B08B 3/12 310/313 B |
| 6,346,764 | B1 * | 2/2002 | Boyd | H01L 41/107 310/358 |
| 6,362,559 | B1 * | 3/2002 | Boyd | H01L 41/107 310/359 |
| 6,457,361 | B1 | 10/2002 | Takeuchi et al. | |
| 6,805,009 | B2 * | 10/2004 | Burdess | G01M 3/16 422/69 |
| 6,840,123 | B2 * | 1/2005 | Takeuchi | B06B 1/06 73/865 |
| 6,880,402 | B1 * | 4/2005 | Couet | E21B 47/085 73/579 |
| 6,886,406 | B1 * | 5/2005 | Couet | E21B 37/06 73/579 |
| 6,955,787 | B1 * | 10/2005 | Hanson | G01N 29/022 29/592 |
| 7,178,378 | B2 * | 2/2007 | Crawley | B81B 3/0089 73/24.01 |
| 7,322,243 | B2 * | 1/2008 | Liu | G01N 17/02 422/53 |
| 8,006,561 | B2 * | 8/2011 | Konno | G01G 3/16 73/649 |
| 8,168,120 | B1 * | 5/2012 | Younis | G01N 29/022 422/82.01 |
| 2002/0189375 | A1 * | 12/2002 | Takeuchi | G01G 3/13 73/865 |
| 2003/0123059 | A1 * | 7/2003 | Krempl | G01N 29/036 356/338 |
| 2005/0262943 | A1 | 12/2005 | Claydon et al. | |
| 2006/0274514 | A1 * | 12/2006 | Yoshioka | B41J 2/125 361/790 |
| 2007/0119232 | A1 * | 5/2007 | Konno | G01N 29/036 73/24.01 |
| 2008/0100176 | A1 * | 5/2008 | Haskell | G01H 11/08 310/313 R |
| 2008/0122320 | A1 * | 5/2008 | Fazzio | H04R 17/02 310/366 |
| 2008/0163694 | A1 * | 7/2008 | Haskell | G01N 29/2412 73/652 |
| 2009/0114798 | A1 * | 5/2009 | Tigli | H03H 9/14547 250/200 |
| 2010/0207602 | A1 * | 8/2010 | Loverich | G01N 29/2437 324/76.49 |
| 2010/0297687 | A1 * | 11/2010 | Mutharasan | G01N 29/036 435/29 |
| 2012/0094270 | A1 * | 4/2012 | Mutharasan | G01N 33/54373 435/5 |
| 2013/0029350 | A1 * | 1/2013 | Cooper | G01N 29/022 435/7.1 |
| 2013/0130362 | A1 * | 5/2013 | Hines | G01N 29/024 435/287.1 |
| 2014/0007692 | A1 * | 1/2014 | Hines | G01N 29/12 73/658 |
| 2014/0234171 | A1 * | 8/2014 | Yamaguchi | G01N 29/022 422/69 |
| 2014/0305191 | A1 * | 10/2014 | Schmid | G01N 9/002 73/24.03 |
| 2014/0360890 | A1 * | 12/2014 | Mutharasan | G01N 29/245 205/775 |
| 2015/0064723 | A1 * | 3/2015 | Mutharasan | G01N 27/02 435/7.23 |
| 2015/0082865 | A1 * | 3/2015 | Ozaki | G01N 29/036 73/24.06 |
| 2015/0107357 | A1 * | 4/2015 | Hentz | G01D 5/266 73/382 G |
| 2015/0168285 | A1 * | 6/2015 | Hedayat | G01N 15/0656 73/23.33 |
| 2015/0168314 | A1 * | 6/2015 | Matbouly | G01N 22/04 324/633 |
| 2016/0356693 | A1 * | 12/2016 | Tylutki | G01N 15/0656 |
| 2016/0370276 | A1 * | 12/2016 | Yang | G01N 15/0656 |
| 2017/0052102 | A1 * | 2/2017 | Chiang | H01L 21/30604 |
| 2017/0052103 | A1 * | 2/2017 | Chiang | G01N 15/0606 |
| 2017/0069187 | A1 * | 3/2017 | Adams | G01N 33/0047 |
| 2017/0234822 | A1 * | 8/2017 | Ruhl | G01N 27/221 324/679 |
| 2018/0221921 | A1 * | 8/2018 | Magee | B08B 7/028 |
| 2018/0328889 | A1 * | 11/2018 | Hansen | G01N 15/0606 |
| 2020/0378880 | A1 * | 12/2020 | Agarwal | G01N 15/0656 |

* cited by examiner

FEM-model 01-mode 11-mode

SENSOR ELEMENT, PARTICLE SENSOR DEVICE AND METHOD FOR DETECTING A PARTICULATE MATTER DENSITY

CROSS-REFERENCE TO RELATED APPLICATIONS

This application claims the benefit of European Patent Application No. 19165334, filed on Mar. 26, 2019, which application is hereby incorporated herein by reference.

TECHNICAL FIELD

Embodiments relate in general to the field of sensors and, more specifically, to the field of particle sensor elements, particle sensor devices and a method for detecting a particulate matter density in the ambient atmosphere of the sensor element. Thus, embodiments may relate to a particle sensor based on a bi-stable piezoelectric MEMS membrane with a self-cleaning capability.

BACKGROUND

The detection of the environmental parameters, e.g., a particulate matter density, in the ambient atmosphere is becoming important in the implementation of appropriate sensors within mobile devices, for example, but also in application in home automation, such as smart home and, for example, in the automotive sector. However, with the evermore extensive use of sensors, there is also a particular need to be able to produce such particle sensors as inexpensively as possible and thus, cost-effectively, but nevertheless the resulting reliability and accuracy of the particle sensors should be maintained or even increased.

As in the recent years, the manufacturing of nanomaterials has significantly increased, this has also raised concerns regarding the exposure of humans to particulate matter (PM) and the adverse effects on health associated with prolonged intake, mainly by inhalation. The particulate matter may be classified in course particulate matter with a particle diameter greater than 2.5 µm, fine particulate matter with a particle diameter less than 2.5 µm and nano particulate matter with a particle diameter below 100 nm. Assessing the individual exposure in the personal breathing zone (PBZ=30 cm hemisphere around mouth and nose) for safety reasons requires relatively small and lightweight monitoring devices for particulate matter, which give reliable real-time information on the particulate matter density in the ambient atmosphere.

Particulate matter in the ambient atmosphere may comprise a mixture of solids and liquid droplets. In addition to the detection of the particulate matter pollution in the ambient atmosphere, the detection and control of particles, e.g., in clean rooms, or generally particles in a fluid, e.g., in gasses or liquids, may be necessary. In this context, gasses and liquids are collectively referred to as fluids.

For the detection and measurement of particles or particulate matter, different approaches are currently used. However, one major obstacle of all particulate matter sensors it the regeneration of the sensor surface after PM saturation, wherein the removal of the sensor with subsequent external cleaning procedures or the usage of disposable sensors can be avoided.

Generally, there is a need on the field of particulate matter sensors for an approach to implement improve particulate matter sensors providing an adequate long term sensitivity for the particulate matter to be detected by the sensor device and having reduced fabrication requirements.

Such a need can be solved by the sensor element according to claim 1, the particle sensor device according to claim 7 and the method for detecting a particulate matter density in the ambient atmosphere according to claim 18.

SUMMARY

According to an embodiment, a sensor element comprises a membrane structure suspended on a frame structure, wherein the membrane structure comprises a membrane element and an actuator, wherein the membrane structure is deflectable in a first stable deflection state (=position) and in a second stable deflection state (=position) and is operable in a resonance mode in at least one of the first and the second stable deflection states, and wherein the actuator is configured to deflect the membrane structure in a first actuation state into one of the first and the second stable deflection states, and to operate the membrane structure in a second actuation state in a resonance mode having an associated resonance frequency.

According to an embodiment, a particle sensor device comprises the sensor element and a controller configured to provide the actuator in the first actuation state with a first actuation signal and in the second actuation state with a second actuation signal, and to detect a shift of the resonance frequency of the membrane structure based on particles adhering to the membrane structure.

According to an embodiment, a method for detecting a particulate matter density in the ambient atmosphere with the sensor element comprises the steps of providing the actuator in the first actuation state with a first actuation signal and in the second actuation state with a second actuation signal, detecting a shift of the resonance frequency of the membrane structure based on the amount of particles adhering to at least one of the main surface regions of the membrane structure, and providing an output signal having an information on the amount of particulate matter adhering to the deflectable portion of the membrane structure based on the frequency dependent impedance of the actuator.

According to a further embodiment, the method further comprises operating the membrane structure in a self-cleaning state by switching the membrane structure between the first and the second stable deflection state.

BRIEF DESCRIPTION OF THE DRAWINGS

Embodiments of the present sensor element, particle sensor device and method for detecting a particulate matter density in the ambient atmosphere are described herein making reference to the appended drawings and figures.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices and sensor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, the figures comprise a Cartesian coordinate system x, y, z, wherein the x-y-plane corresponds, i.e. is parallel, to the first main surface plane of the substrate (=frame structure), and wherein the depth direction vertical to the x-y-plane corresponds to the "z" direction, i.e. is directed to the z direction. In the following description, the term "lateral" means a direction in the ±x-direction, wherein the term "vertical" means a direction in the ±z-direction.

Figure 1:
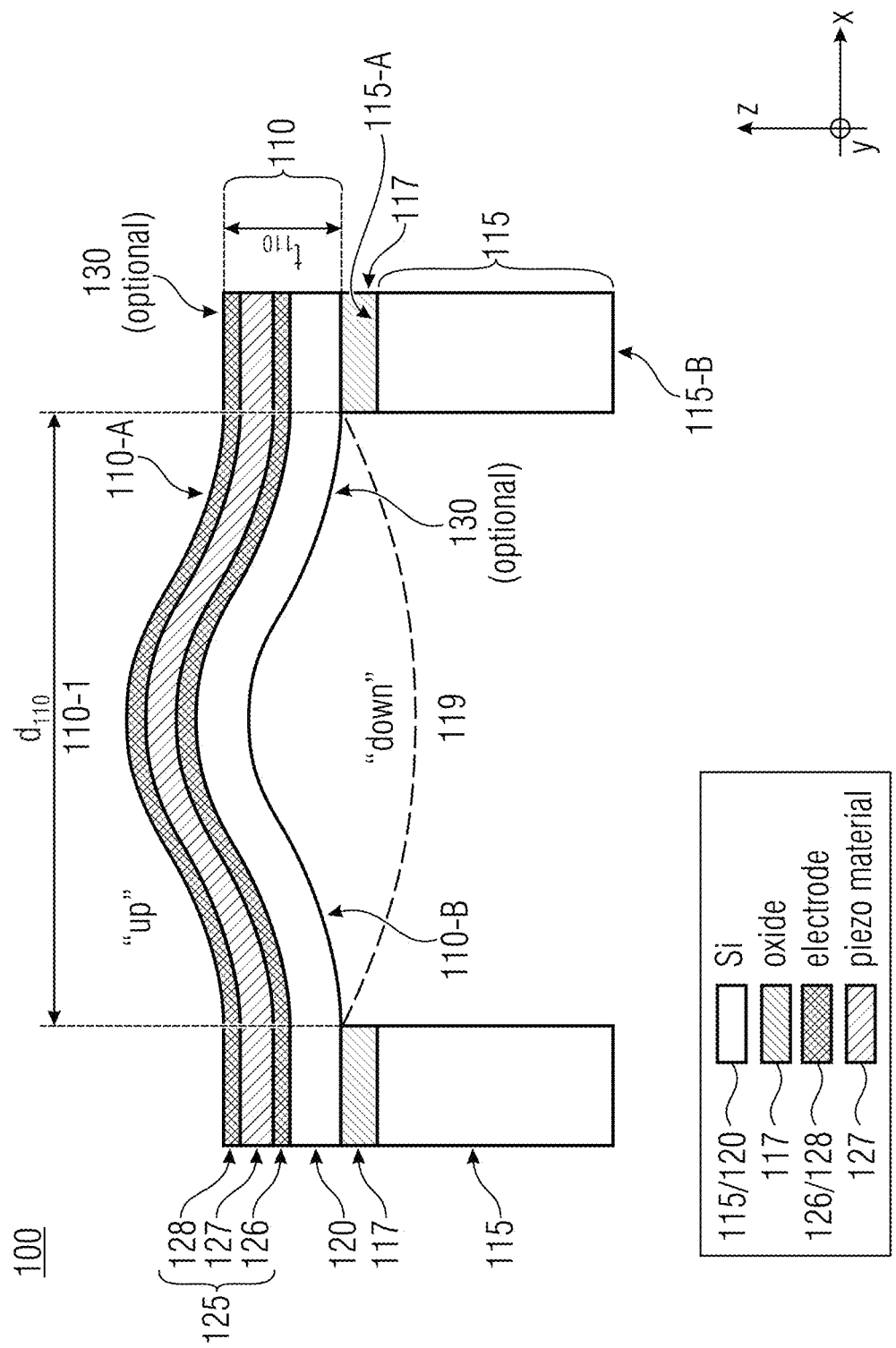
FIG. 1 shows a schematic cross-sectional view of a sensor element according to an embodiment.

FIG. 1 shows a schematic cross-sectional view of a sensor element 100 according to an embodiment. In FIG. 1, the drawing plane is parallel to the x-z-plane.

The sensor element 100 comprises a membrane structure 110 which is suspended on a frame structure 115. The membrane structure 110 comprises a membrane element 120 and an actuator 125. The membrane structure 110 is deflectable in a first stable deflection state and in a second stable deflection state and is operable in a resonance mode in at least one of the first and second stable deflection states or in both stable deflection states. Thus, the membrane structure 110 may form a bi-stable or a multi-stable membrane structure, wherein the membrane structure 110 is situated in one of the first and second stable deflection states (=positions) and is switchable to the other stable deflection state (=position).

The actuator or transducer 125 is configured to deflect the membrane structure 110 during a first actuation state into one of the first and the second stable deflection states, and is further configured to operate the membrane structure 110 during a second actuation state in a resonance mode having an associated resonance frequency $f_{RES}$.

According to an embodiment, the membrane element 120 is mechanically coupled or attached to the frame or support structure 115, e.g., a semiconductor substrate, and may be formed as a micro-machined MEMS membrane element 120 (MEMS=microelectromechanical system). An insulating material layer 117, e.g., a spacer or insulator layer comprising an oxide material, for example, may be arranged between the membrane element 120 and the frame structure 115.

According to a MEMS membrane manufacturing process, the membrane element 120 may be applied on a substrate 115, e.g. comprising a semiconductor material, wherein an insulating material layer 117 is arranged between the substrate 115 and the membrane element 120. During the manufacturing process, an etching step, e.g., a Bosch etching step, may be conducted from a second main surface region 115-B of the semiconductor substrate 115 for providing a cavity 119 in the substrate 115 and for providing the frame structure 115. The insulating material layer 117 may act as an etch stop layer for the etching process. During manufacturing processing steps, the actuator 125, e.g., an actuator layer stack, may be applied on the membrane element 120 for providing the membrane structure 110. The cavity 119 exposes the movable or deflectable portion 110-1 of the membrane structure 110. In this connection, it is pointed out to the fact that the above schematic illustration of a manufacturing process for providing the membrane structure 110 is only one example of multiple ways of how to fabricate and provide a micro-machined MEMS membrane structure.

According to an embodiment, the actuator 125 may formed as an actuator layer stack mechanically coupled to the membrane element 120, wherein the actuator layer stack may comprise at least one piezoelectric functional layer 127 in a sandwiched configuration between a first and second electrode structure 126, 128.

According to an embodiment, at least one layer of the actuator layer stack 125 or the membrane element 120 or another optional layer (not shown in FIG. 1) of the membrane structure 110 is configured to exert a mechanical stress to the membrane structure 110 for providing a buckling of the membrane structure 110, e.g., based on an effective compressive step. Thus, the sensor element 100 may comprise a buckled membrane structure 110 having (at least) the first and second stable deflection state.

According to an embodiment, the sensor element 100 may comprise a bi-stable (multi-stable) buckled, micro-machined membrane structure 110 suspended on the frame or support structure 115. Based on the respective first actuation state of the actuator 125, the membrane structure 110 may comprise one of a first and second stable deflection stage. The actuator layer stack 125 may be arranged on and mechanically coupled to a first main surface region 120-A of the membrane element 120. Thus, the actuator layer stack 125 may form piezoelectric transduction elements mounted on the micro-machined membrane element 120, wherein the piezoelectric transduction elements may comprise the electrode structure 126 mounted on the first main surface region 120-A of the membrane element 120, the piezoelectric functional layer 127 on the first electrode structure 126 and the second electrode structure 128 mounted on the piezoelectric functional layer 127. All electrode pairs in form of the first and second electrode structure 126, 128 sandwiching the piezoelectric functional layer 127 can be individually connected to electrical signals, e.g., provided from a controller (not shown in FIG. 1).

According to an embodiment, the buckling of the micro-machined membrane structure 120 may be achieved by an effective compressive stress in the membrane structure 110, i.e., in one of the layers or elements of the membrane structure 110. The compressive stress may be induced by introducing defined mechanical stresses in one or more thin film layers on top of the membrane element 120 or by introducing the defined stress in the membrane element 120 itself. As a result, the buckled membrane structure 110 comprises the first and second stable deflection state, wherein FIG. 1 shows the buckled membrane structure 110 in the first stable deflection state (=up position).

According to an embodiment, the sensor element 100 may optionally comprise an adhesive functional layer 130 on at least one (or on both) of the two main surface regions 110-A, 110-B of the bi-stable membrane structure 110 for providing a "defined" adhesive effect to particulate matter in the environmental atmosphere of the membrane structure 110. The adhesive functional layer or film 130 may provide a functional surface with a lower or higher adhesive effect to particles or particulate matter than the material of the membrane structure 110 at the first and second main surface region 110-A, 110-B. The adhesive functional layer 130 may, for example, provide a surface modification of at least one of the first and second main surface regions 110-A, 110-B of the membrane structure 110 to promote a particle or particulate matter adhesion in areas on the membrane structure 110 with a higher mass sensitivity, wherein areas of the membrane structure 110 with a low mass sensitivity may provide a reduced adhesion of a particle or particulate matter, for example. The areas with higher and lower mass sensitivity may be chosen depending on the resonance mode or resonance modes for operating the membrane structure 110 during the second actuation state.

A particle sensitive (=active) area 105 of the sensor element 100, which is exposed to the environmental atmosphere and which contributes to the detection of the particulate matter, may be, for example, a part of at least one of the first and second main surface regions 110-A, 110-B of the active (=deflectable) portion 110-1 of the membrane structure 110 and/or a part of the adhesive layer 130, which is arranged at the active (=deflectable) portion 110-1 of the membrane structure 110.

According to an embodiment, the adhesive functional layer 130 may be at least partially micro- and/or nano-structured, i.e. at least a part of the surface region of the adhesive functional layer 130, which forms the particle sensitive (=active) area 105 and is exposed to the environmental atmosphere, may comprise a micro- and/or a nano-structure or structures 135. The micro- or nano-structure(s) 135 or the combination of micro- and nano-structure(s) 135 may be provided to tune or locally dimension (=locally increasing or decreasing) the adhesion properties of the particulate matter to the adhesive layer 130.

According to a further embodiment, the membrane structure 110 or the membrane element 120 may be at least partially micro- and/or nano-structured, i.e. at least a part of the surface region of the membrane structure 110 or the membrane element 120, which forms the particle sensitive (=active) area 105 and is exposed to the environmental atmosphere, may comprise a micro- and/or a nano-structure or structures 135. The micro- or nano-structure(s) 135 or the combination of micro- and nano-structure(s) 135 may be provided to tune or dimension the adhesion properties of the particulate matter to the membrane structure 110 or the membrane element 120.

The micro- and/or nano-structure(s) 135 may provide a surface modification of the particle sensitive area 105 of the sensor element 100 to promote a particle or particulate matter adhesion in areas on the membrane structure 110 with a higher mass sensitivity, wherein areas of the membrane structure 110 with a low mass sensitivity may provide a reduced adhesion of a particle or particulate matter, for example. The areas with higher and lower mass sensitivity may be chosen depending on the resonance mode or resonance modes for operating the membrane structure 110 during the second actuation state.

The micro- and/or nano-structure(s) 135 may further provide a surface modification of the particle sensitive area 105 of the sensor element 100 to provide a size dependent particle or particulate matter adhesion to the particle sensitive area 105. Thus, the sensor element 100 may designed for a specific classification of particulate matter, e.g. course particulate matter with a particle diameter greater than 2.5 μm, fine particulate matter with a particle diameter less than 2.5 μm and nano particulate matter with a particle diameter below 100 nm.

According to a further embodiment, the sensor element 100 may further comprise a heating element 140 arranged for changing in an actuated condition a temperature in the particle sensitive area 105, in the active (=deflectable) portion 110-1 of the membrane structure 110, or in the entire membrane structure 110. The heating element 140 may be arranged adjacent or close to the particle sensitive area 105 and the micro- and/or nano-structure(s) 135.

According to the architecture of the particle sensor element 100 of FIG. 1, the fundamental building block of the particle sensor element is the buckling micro-machined membrane structure 110 which may have a circular, elliptical, rectangular, square or any polygonal circumferential shape. The membrane structure 110 comprises the actuator 125, e.g., in form of an actuator layer stack comprising a bottom electrode layer 126 and a top electrode layer 128 each comprising for example a highly conductive material, e.g., Cr/Ti, Au, etc., wherein the piezoelectric functional layer 127, which is sandwiched between the first and second electrode structures 126, 128, may comprise at least one or a plurality of piezoelectric thin film(s), e.g., comprising an AlN, ScAlN, PVDF-TrFe, ZnO, etc. The membrane structure 110 may further comprise optional insulating (=dielectric) layers (not shown in FIG. 1) which may comprise a dielectric material as $SiO_2$, SiON, SiN, etc. According to an embodiment, the buckling of the membrane structure 110 may be achieved by defined or tailored stress(es) in at least one of the thin films of the membrane structure 110 or in the piezoelectric layer 127 resulting in effective compressive stress.

According to the exemplary implementation of the sensor element 100 as shown in FIG. 1, typical membrane structure diameters $d_{110}$ (=the diameter of the movable portion 110-1 of the membrane structure 110) may be in the range of 200 to 1500 µm or in the range of 500 to 1000 µm, wherein typical thickness values $t_{110}$ of the membrane structure 110 are in the range of 0.5 to 20 µm, or in the range of 5 to 15 µm.

According to an embodiment, the adhesive functional layer 130 may form the "top" layer of the membrane structure 110, wherein the adhesive functional layer 130 may be applied on at least one of the first and second, opposing main surface regions 110-A, 110-B of the membrane structure 110. The adhesive functional layer can be implemented to provide a defined (lower or higher) adhesion of particles when compared to the material of the first and second main surface regions 110-A, 110-B of the membrane structure 110.

FIGS. 2a-2e show schematic plane views of different possible implementations of at least one of the electrode structures 126, 128 of the actuator 125 of the sensor element 100 according to an embodiment.

At least one (or both) the first and second electrode structures 126, 128 may be segmented, e.g., symmetrically segmented, into at least two electrode structure segments for allowing a mode selective excitation of different resonance modes of the membrane structure 110. The different segments of the at least one (or both) of the electrode structures 126, 128 may be electrically isolated allowing for an individual provision of actuation signals or of different actuation signals to the respective electrode segments of the segmented electrode structure(s) 126, 128.

The design of the electrode structures 126, 128 and/or of the electrode segments of the segmented electrode structures 126, 128 can be tailored to the desired mode shape during a resonance operation of the membrane structure 110 in one of the ground states of the membrane structure 110, i.e., in one of the first and second stable deflection states. Moreover, the design of the electrode structures 126, 128 can also effect the bi-stable switching mode shape of the membrane structure 110. In this connection, it is pointed out to the fact that the bi-stable switching between the two stable ground states (=stable deflection states) may also have a distinguished mode shape and can be changed due to the chosen design of the electrode structures and due to the timed actuation of the different electrode segments of the segmented electrode structure 126, 128.

As indicated above, the membrane structure 110 and the electrode structures 126, 128 of the actuator 125 may comprise any polygonal circumferential shape, e.g., a circular, elliptical, rectangular, square, etc. circumferential shape. For facilitating the explanation of a possible segmentation of at least one of the electrode structures 126, 128, the following discussion is based on an exemplary implementation of the membrane element 120 and at least one of the first and second electrode structures 126, 128 in a circular circumferential shape. The different electrode structure designs as illustrated in FIGS. 2a-2e can be applied either to only one of the top electrode structure 128 and the bottom electrode structure 126 or to both of the top and bottom electrode structures 126, 128.

FIGS. 2a-2e refer to the first electrode structure 126, however the following description and explanations are equally applicable to the second electrode structure 128.

Figure 2B:
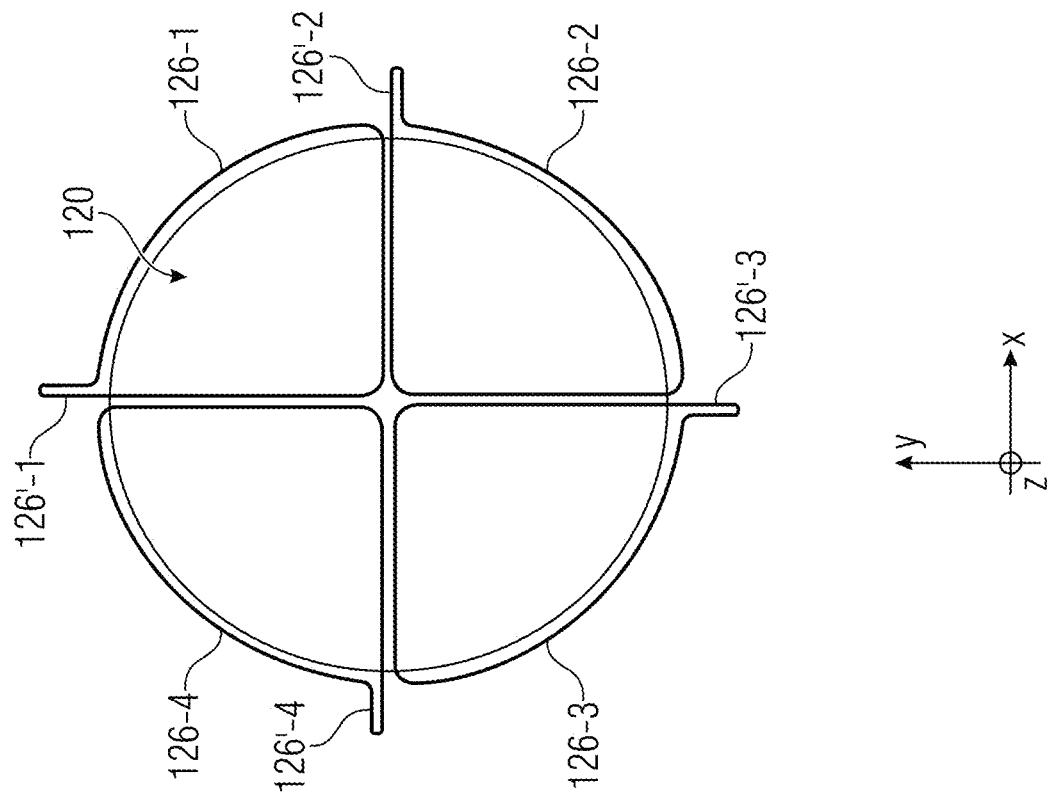
FIGS. 2a-2e shows schematic plane views of an electrode structure of the sensor element according to a further embodiment.
Figure 2A:
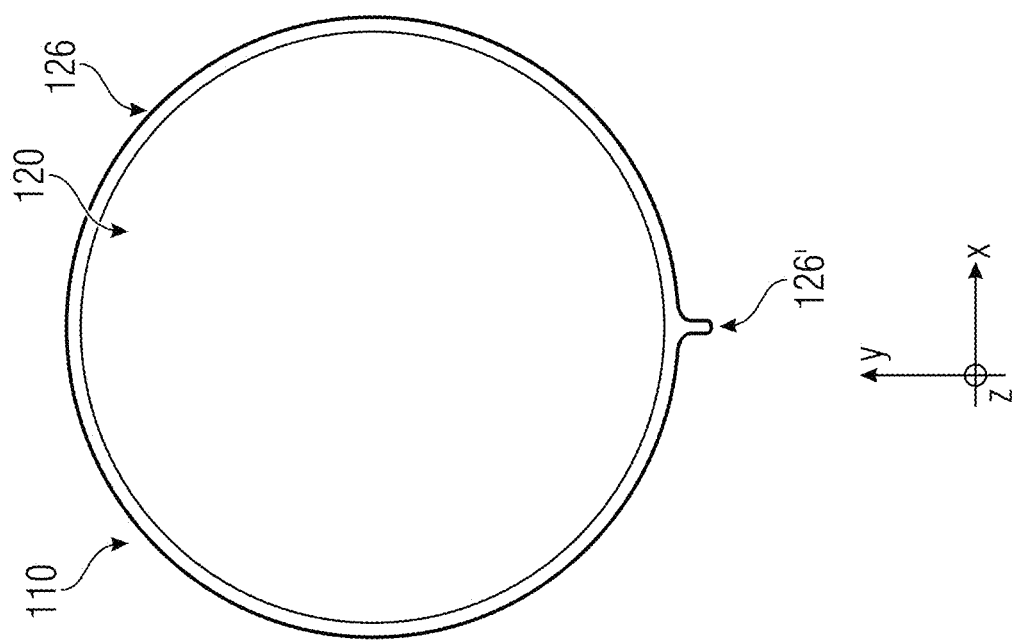

As shown in FIG. 2a, the electrode structure 126 on the membrane element 120 is unsegmented, wherein the membrane element 120 and the electrode structure 126 comprise a circular circumferential shape, for example. The electrode structure 126 may comprise an electrical contact 126'.

As shown in FIG. 2b, the electrode structure 126 may be segmented, e.g. symmetrically segmented, in four electrode portions 126-1, 126-2, 126-3, and 126-4 which are each electrically separated from each other, wherein the first electrode segment 126-1 comprises a first electrical contact 126'-1, the second electrode segment 126-2 comprises a second electrical contact 126'-2, the third electrode segment 126-3 comprises a third electrical contact 126'-3, and the fourth electrode segment 126-4 comprises a fourth electrical contact 126'-4.

Figure 2C:
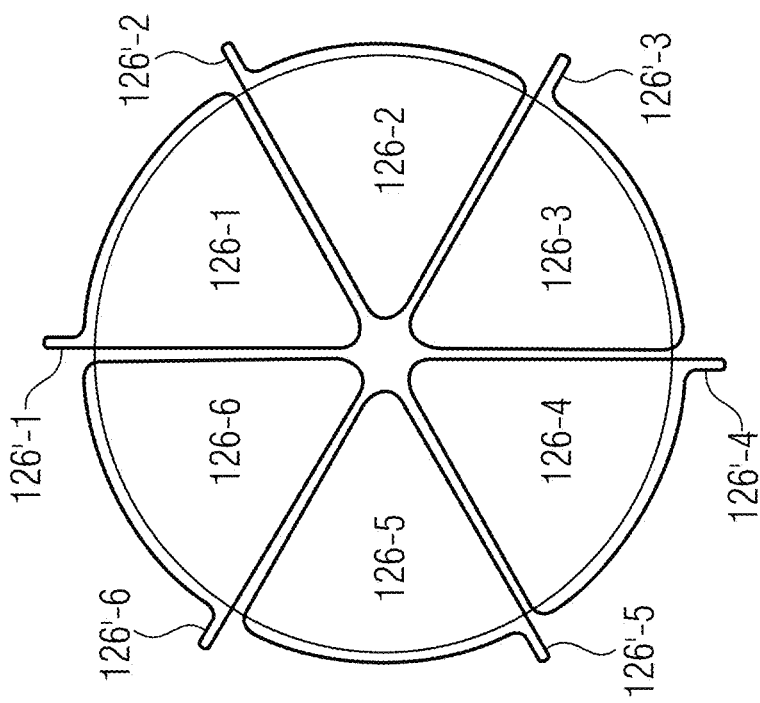
Figure 2C:
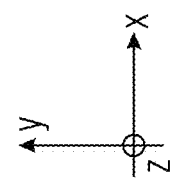

As shown in FIG. 2c, the electrode structure 126 comprises an outer ring structure 126-A and an inner ring structure 126-B which are electrically separated, e.g., by a gap 129, from each other, wherein the outer ring structure 126-A and the inner ring structure 126-B are each segmented in four outer electrode segments 126-A1, 126-A2, 126-A3, 126-A4 and four inner electrode segments 126-B1, 126-B2, 126-B3, 126-B4, which are electrically isolated from each other. Each or any subset of the electrode segments 126-A1-126-A4 and 126-B1-126-B4 may comprising an associated electrical contact 126'-A1-126'-A4 and 126'-B1-126'-B4 for receiving an electrical actuation signal.

Figure 2D:
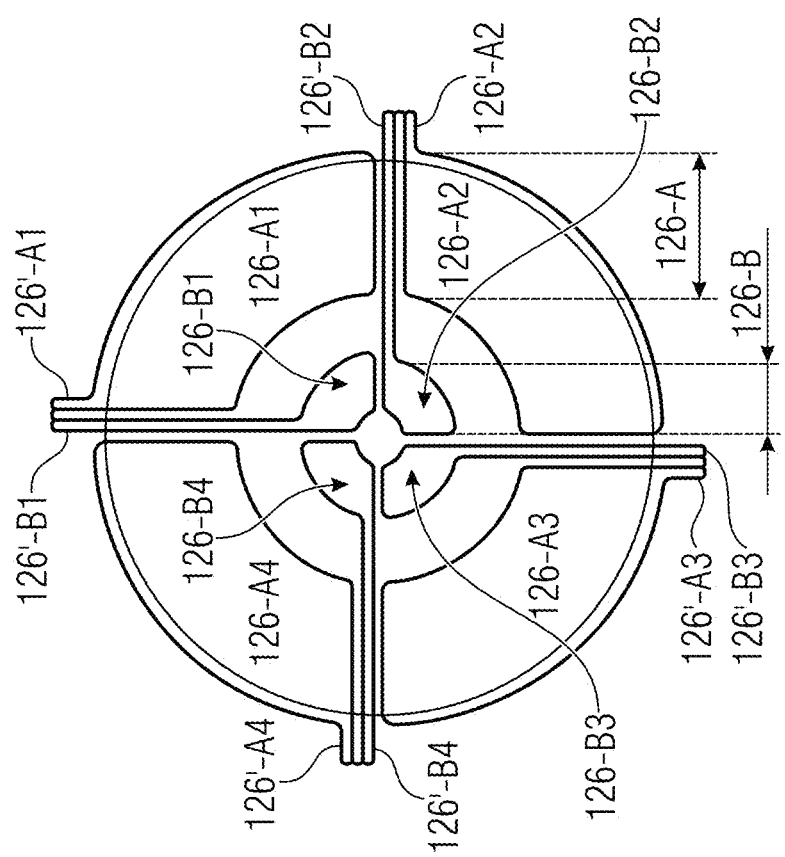
Figure 2D:
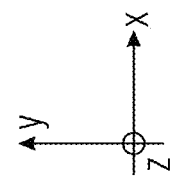

FIG. 2d shows a segmented electrode structure 126 having six symmetrically segmented electrode segments 126-1, 126-2, 126-3, 126-4, 126-5, 126-6, each electrode segment 126-1-126-6 having an electrical contact 126'-1, 126'-2, 126'-3, 126'-4, 126'-5, 126'-6.

Figure 2E:
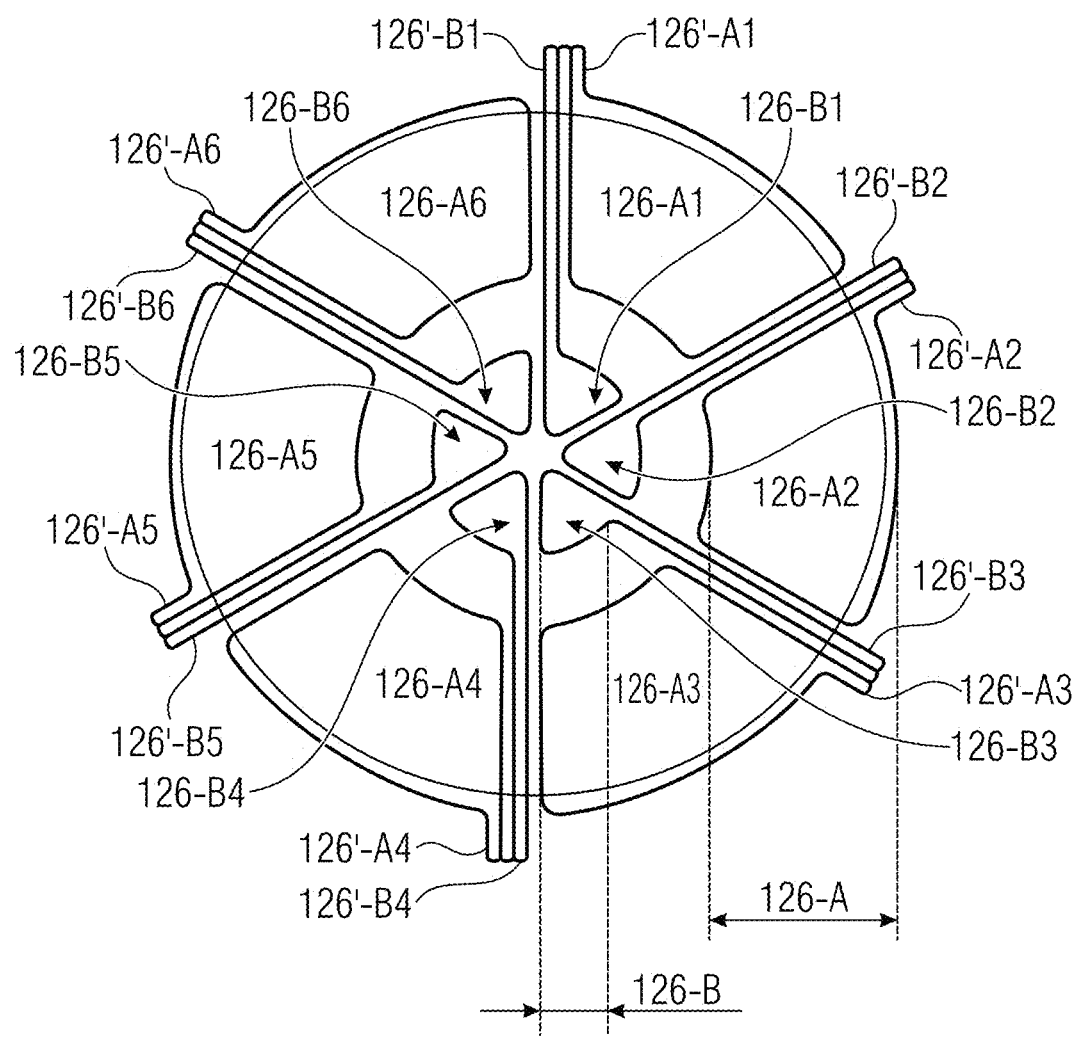

As shown in FIG. 2e, the electrode structure 126 comprises an outer ring structure 126-A and an inner ring structure 126-B which are electrically separated, e.g., by a gap 129, from each other, wherein the outer ring structure 126-A and the inner ring structure 126-B are each symmetrically segmented in six outer electrode segments 126-A1, 126-A2, 126-A3, 126-A4, 126-A5, 126-A6, and six inner electrode segments 126-B1, 126-B2, 126-B3, 126-B4, 126-B5, 126-B6, which are electrically isolated from each other. Each or any subset of the twelve electrode segments 126-A1-126-A6 and 126-B1-126-B4 may comprise an electrical contact 126'-A1-126'-A6 and 126'-B1-126'-B6 for receiving an electrical actuation signal.

The present concept for segmenting at least one of the electrode structures 126, 128 is essentially applicable to any even number of symmetrically segmented electrode segments.

Figure 3:
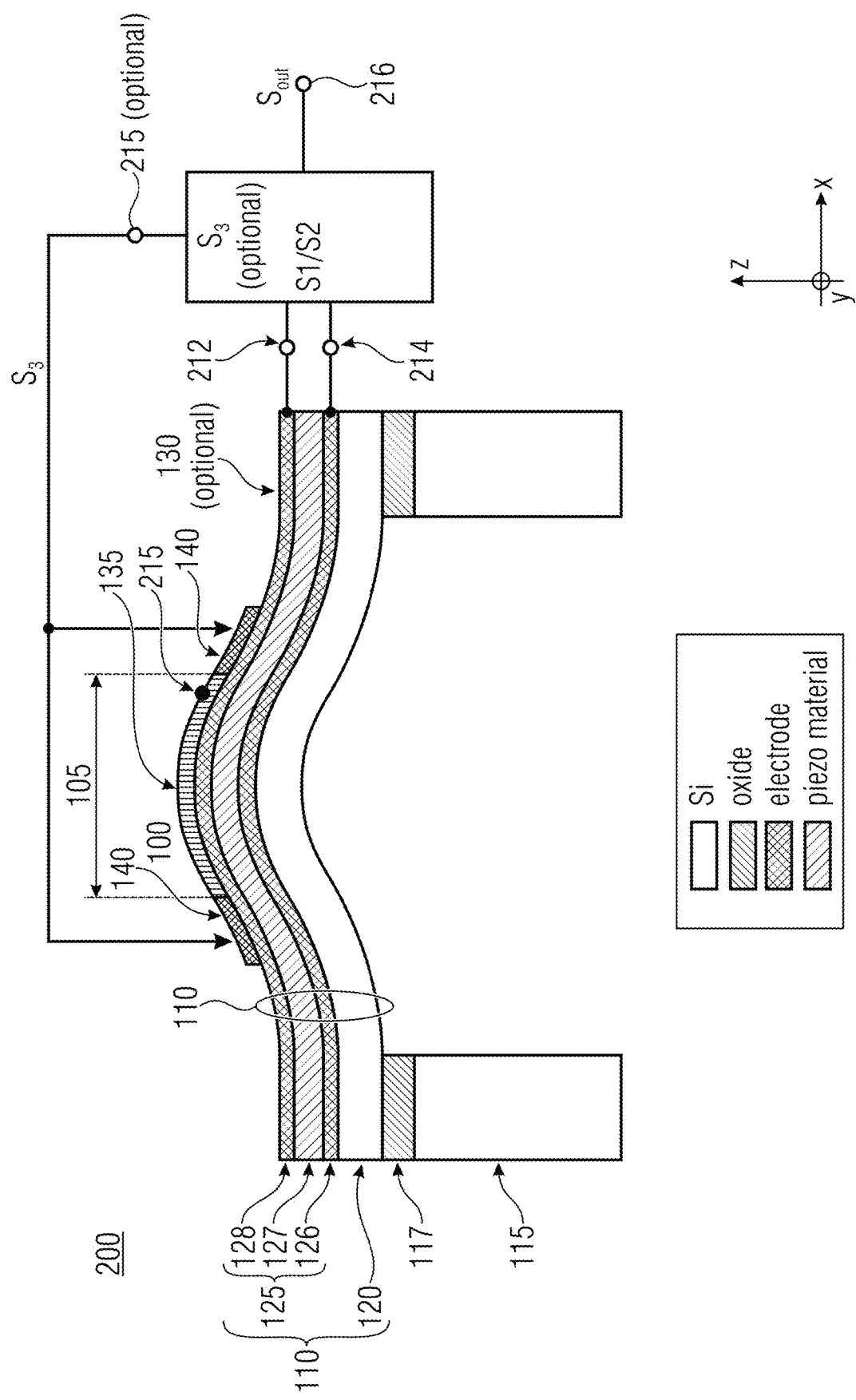
FIG. 3 shows a schematic view of a particulate matter sensor device according to a further embodiment.

FIG. 3 shows a schematic view of a particle sensor device 200 according to a further embodiment. As shown in FIG. 3, the particle sensor device 200 comprises the sensor element 100 as described with respect to FIGS. 1 and 2a-2e. Thus, the above description of the sensor element 100 with respect to FIGS. 1 and 2a-2e is equally applicable to the further embodiments of the particle sensor device 200 as described below.

To be more specific, the sensor element 100 comprises a membrane structure 110 which is suspended on a frame structure 115. The membrane structure 110 comprises a membrane element 120 and an actuator 125. The membrane structure 110 is deflectable in a first stable deflection state and in a second stable deflection state and is operable in a resonance mode in at least one of the first and second stable deflection states or in both stable deflection states. Thus, the membrane structure 110 may form a bi-stable or a multi-stable membrane structure, wherein the membrane structure 110 is situated in one of the first and second stable deflection states (=positions) and is switchable to the other stable deflection state (=position). The actuator or transducer 125 is configured to deflect the membrane structure 110 during a first actuation state into one of the first and the second stable deflection states, and is further configured to operate the membrane structure 110 during a second actuation state in a resonance mode having an associated resonance frequency $f_{RES}$.

The particle sensor device 200 (=particulate matter sensor device) further comprises a controller and/or processing device 210 which is configured to provide the actuator 125 in the first actuation state with a first actuation signal S1 and in the second actuation state with a second actuation signal S2, and to detect a shift $\Delta f_{RES}$ of the resonance frequency $\Delta f_{RES}$ of the membrane structure 110 based on particles or particulate matter 215 adhering to the membrane structure 110.

As schematically shown in FIG. 3, the controller 210 has a first and second terminal (as outputs) 212, 214 to provide the first and second electrode structure 126, 128 with the first actuation signal S1 and the second actuation signal S2. In case, at least one of the electrode structures 126, 128 is segmented in a number N of electrode segments, the controller 210 may comprise a plurality of first terminals 212-N and/or second terminals 214-N for individually connecting each of the N electrode segments or any subset of the N electrode segments of the respective first and/or second electrode structure 126, 128 with the first actuation signal S1 and/or the second actuation signal S2.

As the change $\Delta f_{RES}$ of the resonance frequency $f_{-RES}$ of the membrane structure 110 depends on an amount of particulate matter adherent to the deflectable (=movable) portion 110-1 of the membrane structure 110, the particle sensor device 200 can detect particulate matter adhering to the surface 110-A or 110-B of the micro-machined membrane structure 110 by a measurement of a mass-loading induced resonance frequency shift $\Delta f_{RES}$ (during the PM detection mode).

According to an embodiment, the controller 210 may be configured to measure or detect the frequency dependent, electrical impedance $Z_{125}$ of the actuator 125, e.g., the electrical impedance $Z_{125}$ detectable between the first and second electrode structure 126, 128, wherein the impedance of the actuator 125 depends on the resonance frequency $f_{-RES}$ of the membrane structure 110. The controller 210 may be further configured to provide at the third terminal (output) 216 an output signal $S_{out}$ having an information on the amount of particles of the particulate matter adhering to the membrane structure 110, e.g., the deflectable portion 110-1 of the membrane structure 110, based on the impedance of the actuator 125 detected by the controller 125.

Thus, the controller 210 may be configured to provide an excitation of a mechanical membrane resonance of the membrane structure 110 and a detection of a resonance frequency shift due to particulate matter loading by applying electrical signals S1, S2 to the actuator (=transduction elements) 125 and by measuring the frequency dependent impedance of the actuator 125.

According to an embodiment, the controller 210 may be configured to operate the membrane structure 110 based on the second actuation signal S2 or based on variations of the second actuation signal S2 in one of a plurality of different resonance modes of the membrane structure 110, each of the resonance modes having an associated resonance frequency $f_{-RES}$ of the membrane structure 110. The controller 210 is further configured to measure the frequency dependent impedance of the actuator 125 at the different resonance modes of the membrane structure 110. As already indicated above, a change of the resonance frequency $f_{-RES}$ of the membrane structure 110 depends on the amount of particles of the particulate matter and, consequently, on the resulting mass of the particles adhering to the surface of the active (=deflectable) portion 110-1 of the membrane structure 110 so that a mass-loading induced resonance frequency shift $\Delta f_{RES}$ of the membrane structure 110 can be measured by the controller 210.

According to an embodiment, the controller 210 can be further configured to measure the frequency dependent impedances of different resonance modes of the membrane structure 110 and to provide an output signal $S_{out}$ having an information on an amount and/or a position of the particles of the particulate matter adhered to the deflectable portion 110-1 of the membrane structure 110 based on the different frequency dependent impedances of the resonant modes of the membrane structure 110 and detected by the controller 210.

According to a further embodiment, the controller 210 may be configured to operate the membrane structure 110 in a self-cleaning state by switching the membrane structure 110 at least one time or a plurality of times between the first and second stable deflection state, i.e., between the two bi-stable states or positions.

According to a further embodiment, the controller 210 is further configured to provide the heating element 140 with the third actuation signal S3 to increase the temperature in the particle sensitive area 105 of the sensor element 100 for supporting the self-cleaning operation of the membrane structure 110. As schematically shown in FIG. 3, the controller 210 may have a third terminal 215 to provide the heating element 135 with the third actuation signal S3.

The following evaluations with respect to FIGS. 4a-4f and 5a-5c will show that the measurement of the frequency dependent impedance(s) of at least one of a plurality of different resonance modes of the membrane structure 110 may provide a location dependent mass sensitivity of the membrane structure 110 for the adhered particles 215. In this context, the term location relates to a position on the first and/or second main surface region 110-A, 110-B of the membrane structure 110.

Figure 4A:
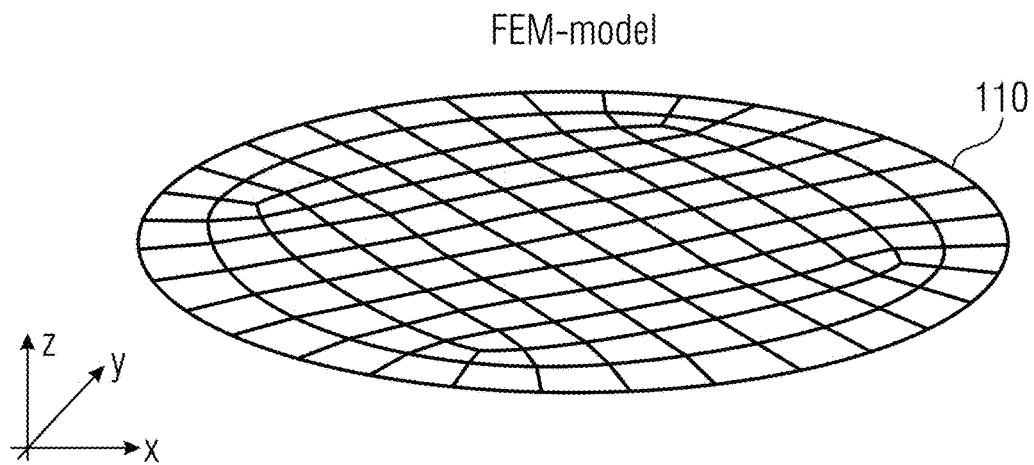
FIGS. 4a-4f show schematic 3D views (snapshots) of different resonance modes of the membrane structure at a maximum excursion according to an embodiment.
Figure 4B:
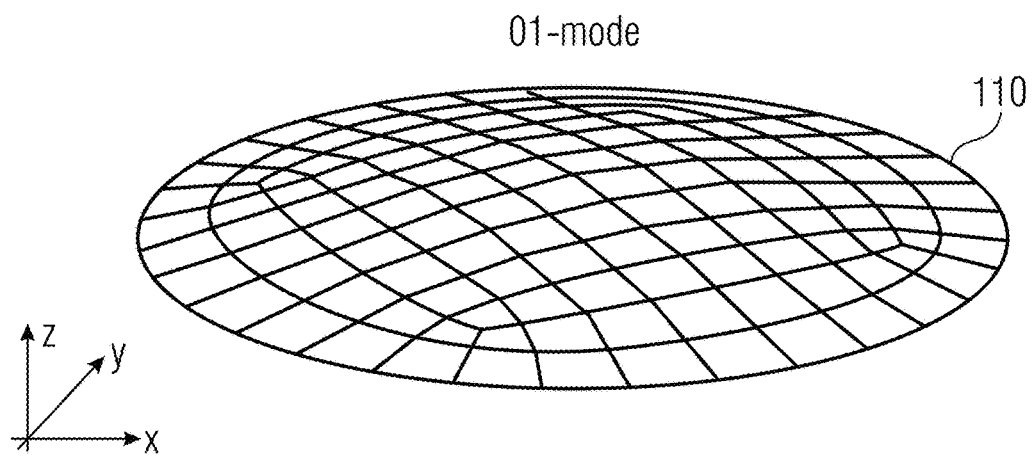
Figure 4C:
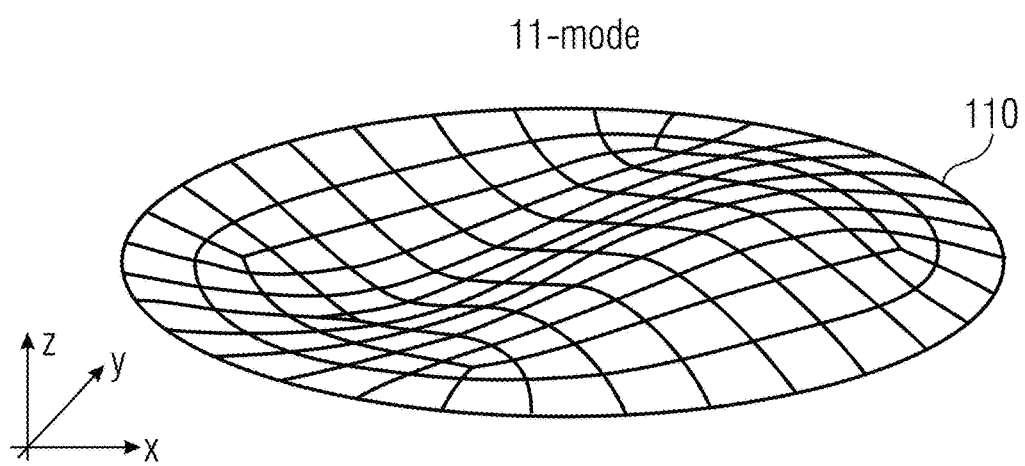
Figure 4D:
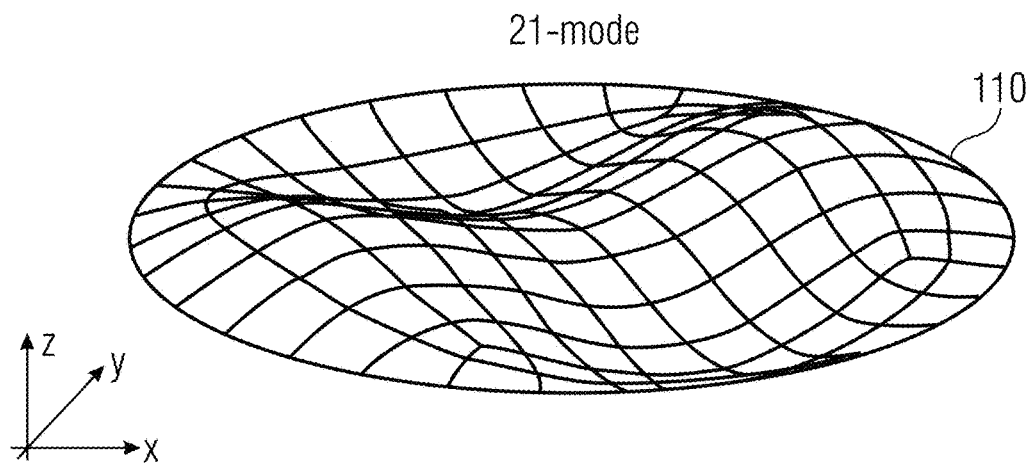
Figure 4E:
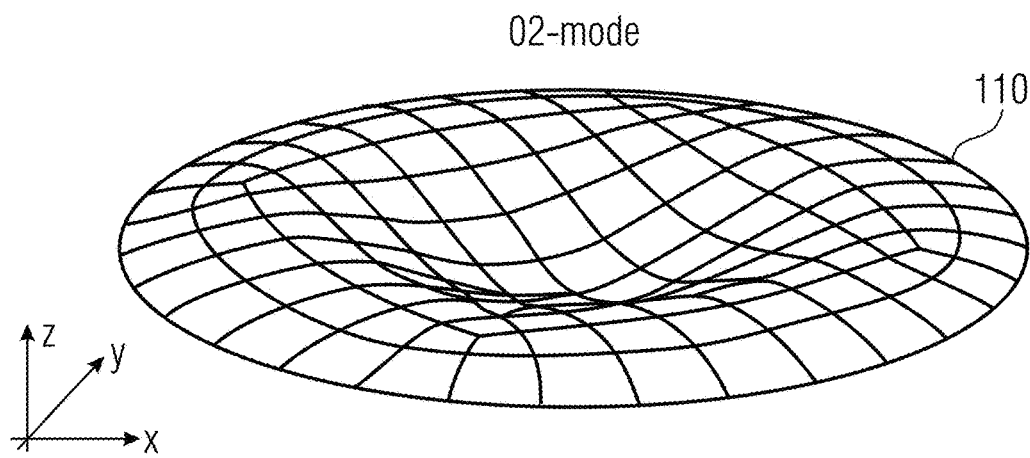
Figure 4F:
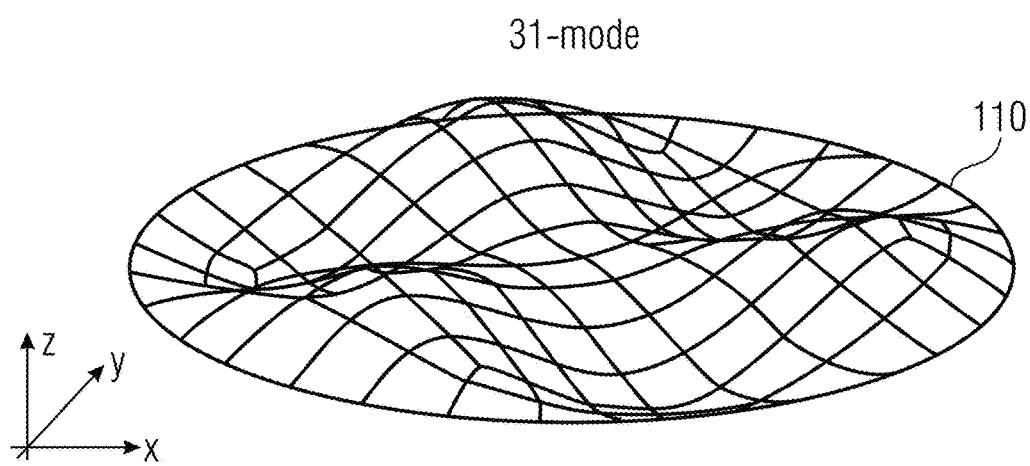

FIGS. 4a-4f how schematic 3D views (snapshots) of FEM (FEM=finite element method) simulation results of the surface topology (as a wire grid) of the membrane structure 110 at different resonance modes according to an embodiment. FIG. 4a shows the mesh of the FEM simulation for the resonance modes of the membrane structure 110, wherein FIGS. 4b-4f show schematic 3D views of different resonance mode shapes of the membrane structure 110 of higher order resonance modes of the membrane structure 110 at a maximum excursion according to a further embodiment. The different mode shapes of the membrane structure 110 as shown in FIGS. 4b-4f show the deflection of the membranes structure in different resonance modes, wherein membrane structure 110 is in one of the first and second stable deflection states. For facilitating the illustration of FIGS. 4a-4f, the curved condition of the membrane structure 110 in the stable deflection state is not considered.

It should be further noted that further resonance modes of the membrane structure 110 are possible, especially based on the different segmentations of at least one of the electrode structures 126, 128 of the membrane structure 110 and on a tailored actuation of the electrode segments of the membrane structure 110.

Figure 5A:
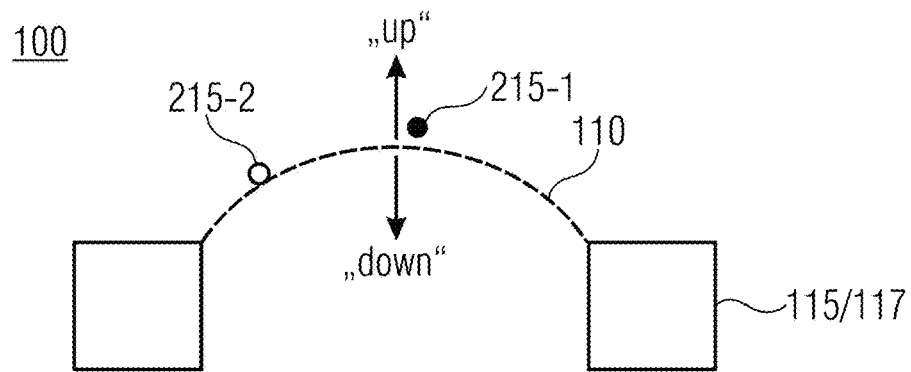
FIGS. 5a-5b show schematic cross-sectional views of the sensor element in different resonance modes of the membrane structure and the principle operating mode of the sensing element according to an embodiment.
Figure 5B:
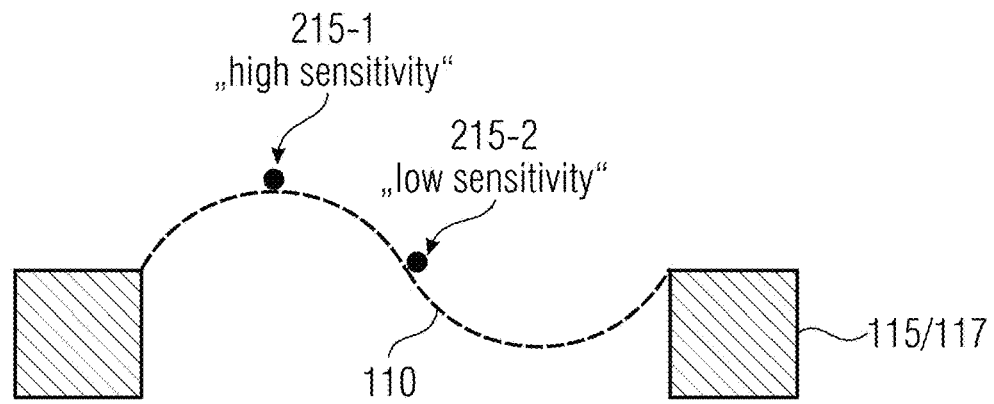

FIGS. 5a-5b show schematic cross-sectional views of the sensor element 100 with different resonance modes of the membrane structure 110. FIG. 5a schematically shows the fundamental resonance mode (01-mode) of the membrane structure 110 in the first stable deflection state (up condition). FIG. 5b shows an exemplary cross-sectional view of the 11-mode of the membrane structure 110 of the sensor element 100 indicating areas of high mass sensitivity and low mass sensitivity.

Figure 5C:
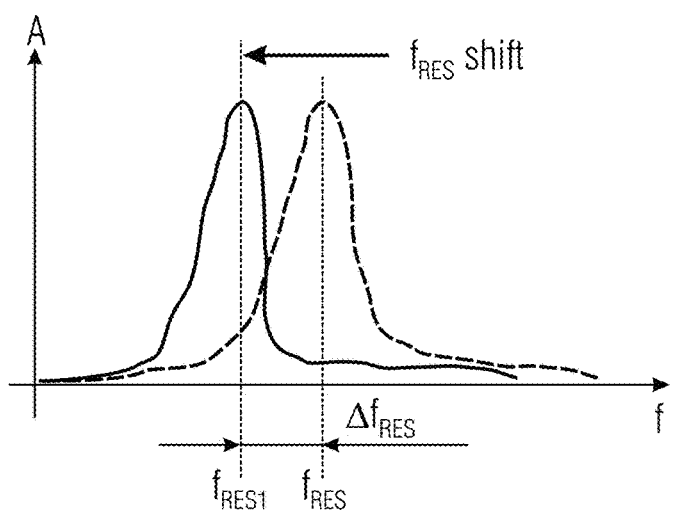
FIG. 5c shows a schematic graphical plot of the dependency of the resonance frequency from the overall mass of particles attached to the deflectable portion of the membrane structure according to an embodiment.

FIG. 5c shows a schematic graphical illustration of the dependency of the resonance frequency on the overall mass of particles attached to the membrane structure 110.

As shown in FIGS. 5a-5b, the buckled membrane structure 110 can be put into a resonance mode in both bi-stable ground states ("up" and "down"), i.e., in both of the first and second stable deflection states of the membrane structure 110, wherein the piezoelectric actuator 125, e.g. in form of transducer elements, may comprise a stack of the bottom electrode 126, the piezoelectric material 127 and the top electrode 128. The resonance frequency $f_{\_RES}$ due to the PM mass loading (PM=particulate matter) gives an indication how much PM mass has adhered to the surface 110-A, 110-B of the membrane structure 110. This is illustrated in FIG. 5c showing the shift $\Delta f_{RES}$ of the resonance frequency $f_{\_RES}$ from the unloaded condition having the resonance frequency $f_{\_RES}$ to the mass loaded condition the resonance frequency $f_{\_RES1}$. The frequency response may be recorded by the controller 210 electrically by measuring the impedance of the actuator 125 or the transducer elements. Thus, FIG. 5c shows the induced shift $\Delta f_{RES}$ of the resonance frequency $f_{\_RES}$ due to PM loading on the surface of the membrane structure 110. The term "A" denotes an amplitude of the resonance mode and the term "f" denotes a frequency.

Referring to FIG. 5a, which shows the fundamental resonance mode (01-mode) of the membrane structure 110 in the first stable deflection state, the particle 215-1 on the surface of the membrane structure 110 experiences a much higher swing than the particle 215-2 as the particle 215-1 is located in a more central position than the particle 215-2. Thus, the particle 215-1 provides a larger contribution to the shift $\Delta f_{RES}$ of the resonance frequency $f_{\_RES}$ then the further particle 215-2 during the resonance mode of FIG. 5a.

Referring to FIG. 5b, which shows the 11-mode of the membrane structure 110 of the sensor element 100, the particle 215-1 on the surface of the membrane structure 110 experiences a much higher swing than the particle 215-2 as the particle 215-1 is located in a more central position than the particle 215-2. Thus, the particle 215-1 provides a larger contribution to the shift $\Delta f_{RES}$ of the resonance frequency $f_{\_RES}$ then the further particle 215-2 during the resonance mode of FIG. 5b.

Thus, tailored designs of the electrode structure 126, 128 based on a segmentation of at least one of the electrode structures 126, 128 allows for a mode selective excitation of the different resonance modes of the membrane structure 110, wherein at least one of the electrode segments is individually connected to an independent signal source provide by the controller 210. Higher order multi-dimensional resonance modes, which have nodal lines in both axial and radial direction, introduce highly strained areas on the two-dimensional membrane surface with a mass sensitivity which is significantly higher than for a simple spring-mass system.

This is exemplarily illustrated in FIG. 5b showing a schematic cross-sectional view of the sensor element 100 with a membrane structure 110 in the 11-mode. As shown in FIG. 5b, the particle 125-2 is located at a nodal line of the 11-mode on the surface of the membrane structure 110. Contrary thereto, the particle 215-1 is arranged on a position on the surface of the membrane structure 110 between two nodal lines and, thus, at a position with maximum swing in the n-mode.

According to an embodiment, at least one of the first and second electrode structures 126, 128 may be segmented into at least two electrically separated electrode structure segments 126'-1, 126'-2 allowing for a mode selective excitation of different resonance modes of the membrane structure 110. Thus, the controller 210 may be configured to individually provide the electrode structure segments of the actuator 125 with the second actuation signal S2 or with different, tailored signal variations of the second actuation signal S2.

Tailored periodic and/or non-periodic signals may be applied to each individual electrode 126, 128 or electrode segment thereof in the PM detection mode for exciting the proper resonance mode in the membrane structure 110. All electrode pairs 126, 128, i.e., the first and second electrode structure 126, 128 sandwiching the piezoelectric layer 127, can be individually connected to the controller 210 for providing individual electrical actuation signals.

According to an embodiment, the controller 210 of the particle sensor device 200 may provide an excitation of different resonance modes with a location dependent mass sensitivity of the membrane structure 110 based on the adhesive functional layer 130, which may provide a defined adhesive effect to particulate matter in the environment atmosphere of the membrane structure 110, which mechanically contacts the membrane structure 110 having the adhesive functional layer 130. Thus, the adhesive functional layer 130 may provide surface modification of the membrane structure 110 to promote an adhesion of particles of the particulate matter in areas of the membrane structure 110 having a high mass sensitivity. Thus, the adhesive function layer 130 may be selectively applied to surface regions of the membrane structure 110 having high mass sensitivity. Thus, the particle sensor 200 may combine an excitation of different resonance modes with a location dependent mass sensitivity with a tailored sensor package having the adhesive functional layer 130 on specific areas of the surface of the membrane structure 110 having a high mass sensitivity in the respective resonance mode of the membrane structure 110. Thus, a guidance of particles of the particulate matter to areas of the membrane structure 110 with high mass sensitivity may be achieved.

Figure 6:
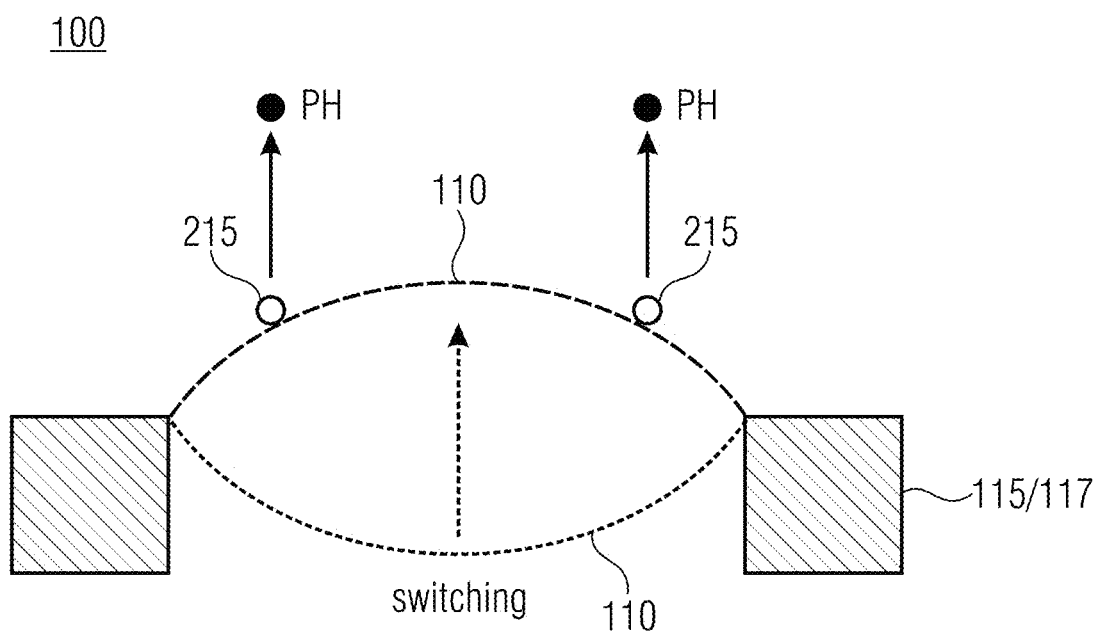
FIG. 6 shows a schematic cross-sectional view of the sensor element for illustrating the cleaning operation of the particle sensor device according to an embodiment.

FIG. 6 shows a schematic cross-sectional view of a sensor element 100 for illustrating a cleaning operation of the particle sensor device 200 according to an embodiment.

The controller 210 may be configured to operate the membrane structure 110 in a self-cleaning state by switching the membrane structure 110 at least one time or a plurality of times between the first and second stable deflection state, i.e., between the two bi-stable states or positions.

Once the particle sensor device 200 is saturated with particles 215 of the particulate matter or before a PM measuring mode, a self-cleaning of the surface of the membrane structure 110 can be achieved by switching the membrane structure 110 from one bi-stable position into the other bi-stable position. During this switching of the membrane structure 110, high accelerations up to $11 \times 10^6$ m/s2 can be reached in a time frame of 5-20 μs. This resulting inertial forces of the particles 215 adhered to the surface 110-A, 110-B of the membrane structure 110 overcome the adhesion force making the particles 215 stick to the surface of the membrane structure 110. This is exemplarily illustrated in FIG. 6 showing a switching operation which induces high g-forces and which cause particulate matter 215 to de-adhere or detach from the surface of the membrane structure 110. This results in a surface cleaning of the membrane structure 110 of the particle sensor device 200.

Switching from one bi-stable ground state to the other bi-stable ground state of the membrane structure 110 during self-cleaning of the sensor surface results in a high acceleration of the membrane structure 110 and, thus, in high inertial forces on the particulate matter adhere to the sensor surface which causes a de-adhesion of the particulate matter from the sensor surface during the self-cleaning mode. Tailored signals (periodic and/or non-periodic) can be applied at each individual electrode 126, 128 or to the different electrode segments in the self-cleaning mode prior to, during, and after switching the membrane structure 110.

In addition, optional surface treatment steps including surface patterning and different passivation coatings 130 may be applied to the surface of the membrane structure 110 to modify the adhesive forces of the particulate matter to the active sensor area 110-1 of the membrane structure 110.

For both operational modes, i.e., resonance modes for PM detection and switching mode for self-cleaning, tailored signals S1, S2, e.g. periodic and/or non-periodic signals, can be applied to the electrode structures 126, 128 in order to optimize both the resonance mode and the switching mode of the particle sensor device 200.

Moreover, independent signals S1, S2, can be applied to all individual electrodes 126, 128 or electrode segments 126-N, 128-N for a mode-selective and application specific operation of the particle sensor device 200. In the switching mode, this may include a different signal for switching initiation (=the time prior to the membrane structure 110 moving from one bi-stable ground state to the other), and the switching itself (=actual movement between the bi-stable states) and after switching (=the membrane 110 coming to a stable condition in the final bi-stable ground state).

Prior to the switching operation, the signal S1, S2 provided by the controller 210 can be optimized for efficient switching initiation and selection of a specific switching mode. During switching, the signal S1 is applied to modify the movement of the membrane structure 110 for achieving a higher or lower acceleration of the membrane structure 110. After switching, the signal is applied to bring the membrane structure 110 into a stable condition, e.g., at rest or back into the resonance mode.

According to an embodiment, the controller 210 may be further configured to adjust the switching operation by setting the number of switching states of the membrane structure 110 and/or by adjusting the inertial forces on the particulate matter 215 adhered to the membrane structure 110, i.e. the acceleration of the membrane structure 110, during the switching state of the membrane structure 110.

The controller 210 may be configured to operate the membrane structure 110 in a self-cleaning state by switching the membrane structure 110 at least one time or a plurality of times between the first and second stable deflection state, i.e., between the two bi-stable states or positions.

According to a further embodiment, the controller 210 is further configured to provide the heating element 140 with the third actuation signal S3 to increase the temperature at least in the particle sensitive area 105 of the sensor element 100 for supporting the self-cleaning operation of the membrane structure 110. The heating element 140 may be arranged adjacent or close to the particle sensitive area 105. A temperature change of the membrane structure 110 in the particle sensitive area 105 may reduce the sticking (=adhesion) of the particles and, thus, allows an efficient detaching of the particles from the particle sensitive area 105 when switching the membrane structure 110 between both bi-stable states.

According to an embodiment, the controller 210 may be further configured to conduct, on an alternating basis, a switching operation of the membrane structure 110 between the two stable deflection states for operating the membrane structure 110 in a self-cleaning state and to measure the frequency dependent impedance of the actuator 125 to detect a shift $\Delta f_{RES}$ of the resonance frequency $f_{RES}$ of the membrane structure 110 based on particles or particulate matter 215 adhering to the membrane structure 110. Moreover, the controller 210 is configured to derive an information on the size and/or the amount of the particles 215 detached from the deflectable portion of the membrane structure 110 during the switching operation based on the impedance change of the actuator 125 between the switched two stable deflection states.

According to an embodiment, the controller 210 may conduct a detection of the particle size due to multiple bi-stable switching processes, as large particles 215 detach and disappear at slower switching processes than smaller particles 215. According to a further embodiment, the controller 210 may conduct a measurement of resonance frequency shift after the cleaning process, e.g. after each bi-stable switching process.

According to an embodiment, a selective periodic excitation of bi-stable MEMS membranes 110 with integrated actuator system 125 may be used for the self-cleaning mode. Bi-stable MEMS membranes 110 have two stable basic states. To switch between the basic states, electrical impulses S1 are usually applied by the controller 210 to the integrated actuator system 125. In order to be able to perform this switching efficiently at a defined point in time and also in a faster manner, a periodic signal may be applied before the actual switching impulse occurs. The bi-stable membrane 110 and/or a membrane array (not shown in FIG. 6) allows for to switch between the two states using the piezoelectric actuator system 125 integrated on the MEMS membrane 110.

According to an embodiment, a periodic electrical signal of sufficiently low amplitude is applied to the bi-stable microstructure 110 which may be electrically driven by the integrated actuator system 110 and which is clamped on at least two sides, the bi-stable microstructure 110 being in one of the two bi-stable basic states. Thus, in the bi-stable basic state, the microstructure 110 is set into vibration. However, the bi-stable basic state is not left due to the excitation. Switching between the two stable basic states may then be triggered in a defined manner by selectively changing the drive signal S1, e.g. provided by the controller 210.

For example, the change of the drive signal S1 may be achieved by amplitude modulation or frequency modulation, i.e. fundamentally by adjusting the excitation signal with the aim of leaving the bi-stable basic state and triggering the switching process.

Switching between the bi-stable basic states of the structure may be carried in the following manners:
 i. once (from one state to the other);
 ii. twice (from one state to the other and back again);
 iii. several times (multiple changes between the bi-stable basic states);
 iv. continuously (continuous changes between the two bi-stable basic states).

The movement of the structure during the switching process between the stable basic states may be selectively influenced by an additional adaption of the drive.

The mechanical movement of the membrane structure 110 may be influenced by an additional adaption of the drive directly after a switching process, when the membrane structure 100 reaches one of the two bi-stable basic states, in such a way that, in the reached bi-stable basic state, the structure may:

i. again follow in a mechanical manner and as quickly as possible a periodic excitation signal which is similar or equal to the excitation signal before the switching process, ii. be set as quickly as possible from the state of movement to a state of rest (having no more kinetic energy).

According to an embodiment, the integrated actuator system 125 may be implemented based on piezoelectric or capacitive transducer principles.

According to an embodiment, the bi-stable membrane structure 110 may be implemented as a micro-machined MEMS membrane 110.

According to an embodiment, several bi-stable membrane structures 110 may be arranged in an array.

a. These may be addressed and driven in groups in different ways:

i. separately by individually driving each membrane structure 110 (groups having a single structure each)

ii. in a grouped manner by individually driving several membrane structures 110 combined in groups which receive the same drive signal S1.

1. This grouping may be based on an application-specific distribution. This also includes groups each having the same number of membrane structures 110.

2. This grouping may be based on a spatial division of the membrane structures 110, e.g. groups of the membrane structures 110 are arranged in an area-filling strip-shaped, shell-shaped, chessboard-like, triangular manner.

3. This grouping may be implemented based on bit groups (2n single structures each in the group of the nth bit).

4. This grouping may be implemented symmetrically, i.e. always exactly two groups each having the same number of membrane structures 110.

b. The groups may be driven oppositely in phase, in-phase or with a defined phase offset with respect to each other.

According to an embodiment, the adapted drive signal S1 that triggers the switching process may be divided into two signal portions, the superimposition of which results in the adapted drive signal. Therefore, an arrangement of the membrane structures 110 in a matrix in which the switching of individual structures may be addressed directly by applying a signal portion of the drive signal in the corresponding row and column is conceivable. Only the membrane structure 110 at the crossing point of both signals will carry out a switching process, since all others see only an insufficiently strong adapted drive signal and remain in their bi-stable resting position.

Figure 7:
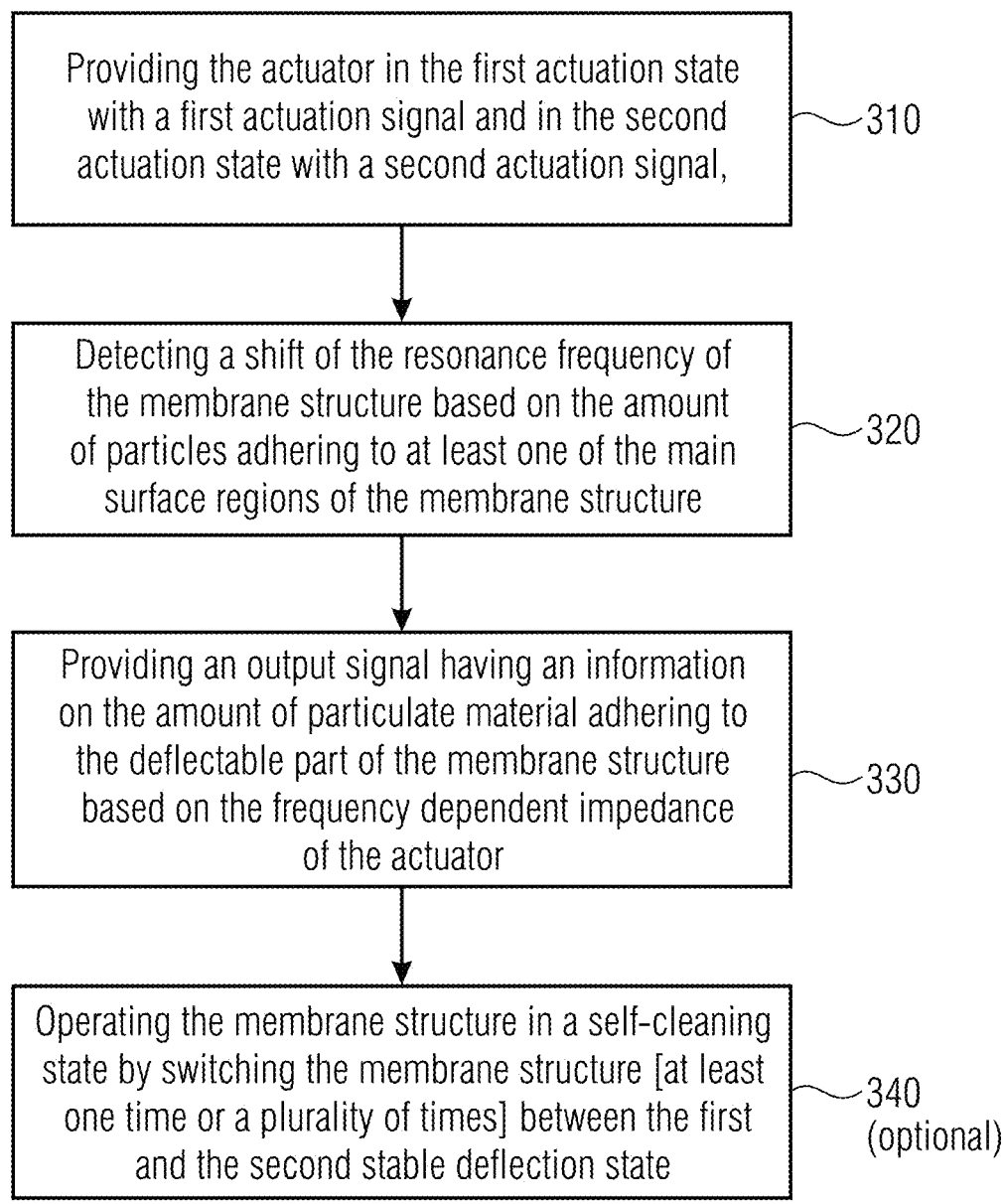
FIG. 7 shows an exemplary process flow (flowchart) of the method for detecting a particulate matter density in the ambient atmosphere according to an embodiment.

FIG. 7 shows an exemplary process flow (flowchart) of the method 300 for detecting a particulate matter density in the ambient atmosphere with the sensor element 100 according to an embodiment. Thus, the method 300 shows the utilization and operation of the sensor element 100 for a PM detection and quantification in the ambient atmosphere, wherein the sensor element 100 may be operated by the controller 210.

As shown in FIG. 7, the method 300 comprises the step 310 of providing the actuator 125 in the first actuation state with a first actuation signal S1 and in the second actuation state with a second actuation signal S2. In step 320, a shift $\Delta f_{RES}$ of the resonance frequency $f_{RES}$ of the membrane structure 110 is detected based on the amount of particles 215 adhering to at least one of the main surface regions 110-A, 110-B of the membrane structure 110. In step 330, an output signal $S_{OUT}$ having an information on the amount of particulate matter adhering to the deflectable portion of the membrane structure 110 is provided based on the frequency dependent impedance of the actuator 125.

In optional step 340, the membrane structure 110 is operated in a self-cleaning state by switching the membrane structure 110 at least one time or a plurality of times between the first and the second stable deflection state.

In a further optional step (not shown in FIG. 7), the heating element 140 may be actuated with the third actuation signal S3 to increase the temperature at least in the particle sensitive area 105 of the sensor element 100 for supporting the self-cleaning operation of the membrane structure 110.

Figure 8:
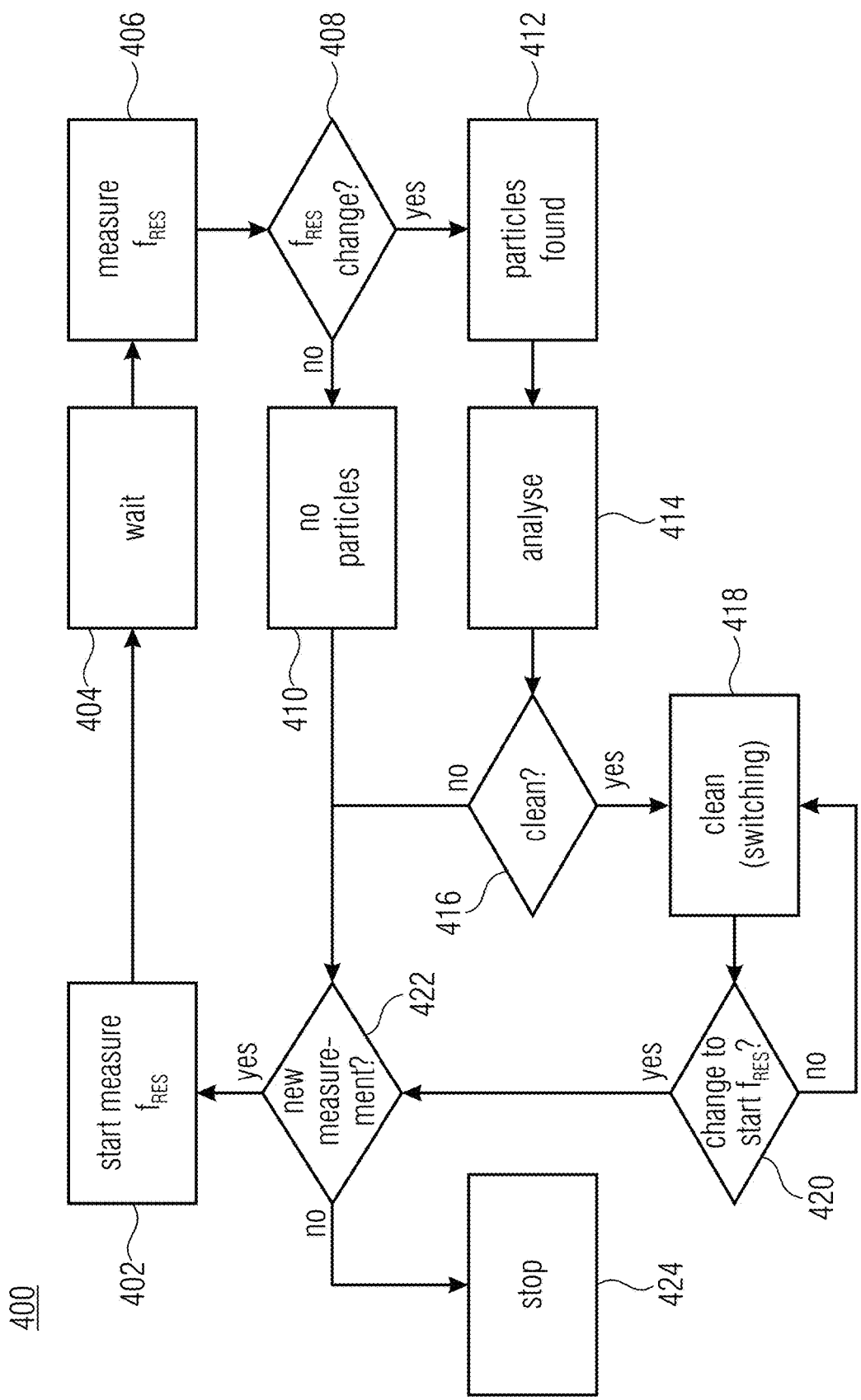
FIG. 8 shows an implementation of an exemplary measurement cycle of the particle sensor device according an embodiment.

FIG. 8 shows an exemplary measurement cycle 400 of the PM sensor device 200 according to an embodiment.

At the beginning (box 402) of the measurement cycle 400, the resonance frequency spectrum within the frequency range of interest is measured. After a defined waiting time (box 404), the resonance frequency, i.e. a certain resonance mode, is measured again (box 406). If there is no change of the resonance frequency (box 408), no particles 215 were detected (box 410). If there is a change (box 412), this change is analyzed in more detail (box 414). If a cleaning of the sensor is desired (box 416), at least one bi-stable switching cycle (box 418 and box 420) is performed until the sensor is clean and at its start ground state (box 422). Larger particles can be fired off the sensor surface with one or two bi-stable switching cycles, smaller particles may need multiple switching cycles. Both ground states can be used to start a measurement cycle (at box 402). If no further measurement is required, the sensor 200 may be in a stop condition (box 424).

Thus, during a measurement cycle 400 of the PM sensor device 200, the controller 210 may conduct, on an alternating basis, a switching operation of the membrane structure 110 between the two stable deflection states for operating the membrane structure 110 in a self-cleaning state and to measure the frequency dependent impedance of the actuator 125 to detect a shift $\Delta f_{RES}$ of the resonance frequency $f_{RES}$ of the membrane structure 110 based on particles or particulate matter 215 adhering to the membrane structure 110.

Some properties of the particle sensor 200 based on bi-stable piezoelectric MEMS membrane 110 with self-cleaning capability can be summarized as follows.

Bi-stable MEMS membranes 110 offer both a resonant operation in the stable ground states of the membrane as well as a very fast switching between both ground states with extremely high acceleration values of up to one million g and large displacements in the range of several μm. Bi-stability in those structures is typically achieved by introducing a carefully adjusted characteristic compressive stress into the membrane either by an additional material layer or by directly adjusting the stress of the membrane material itself. The detection mechanism of PM is based on a mass induced shift $\Delta f_{RES}$ of the resonance frequency $f_{RES}$ upon PM adhesion on the resonating membrane structure 110 based on the equation $\Delta f_{RES}/f_{RES}=(-\Delta m)/m$, with the resonance frequency $f_{RES}$ and the resonator mass m and the $\Delta m$ denoting the change of these respective values upon PM adhesion. From the equation, it is clear, that smaller devices give higher sensitivity. However, the sampling efficiency will also drop significantly due to the small interaction cross-section with the PM stream.

According to the present particle sensor device 200, the designed PM collection scheme can be used to increase the mass sensitivity of the micro-machined membrane structure 110. Moreover, the present PM sensor 200 further provides a regeneration of the sensor surface after PM saturation, by operating the membrane structure 110 in a self-cleaning state by switching the membrane structure 110 at least one time or a plurality of times between the first and second stable deflection state, i.e., between the two bi-stable states or positions. This allows real-time particle removal from the surface of the membrane structure 110.

The basic deflection of the MEMS membrane structure 110 is achieved by tensile stress, e.g., wherein the piezo layer is formed as a stress layer. The piezo layer 127 comprises two complementary basic states, e.g. up and down, wherein a characteristic resonance of the MEMS membrane may be excited in each of the two basic states.

Now, the correlation that a change in mass of the membrane structure 110 by adhesion of particles 215 causes a change in frequency of the resonance frequency is used for particle detection, wherein the following applies: the higher the change in mass, the higher the change in frequency (=reduction of the frequency). For example, a measurement cycle may be comprised of initially performing a reset state at the beginning (flip), in which particles 215 adhering to the membrane structure 110 are released with one or more switching processes of the MEMS membrane structure 110. During the measurement cycle, the "clean" membrane is then excited in the resonance mode, wherein the change of the resonance frequency of the MEMS membrane 110 is detected. The ramp function of the change of the resonance frequency is now an indication, or measure, for the particle quantity, wherein a statement about the particle quantity in the adjacent surrounding medium may be made through the steepness of the ramp function. The steeper the ramp function, the more particles are present in the surrounding atmosphere, i.e. the surrounding atmosphere is dirtier as compared to a flat ramp function, which indicates a relatively clean surrounding atmosphere with respect to the MEMS membrane.

A steeper ramp function may also trigger a more frequent reset, or shorter measurement cycles, to clean the membrane at shorter intervals.

For example, the change of state may be caused by applying a DC voltage or by pulsed signals. Here, accelerations occur at the MEMS membrane so that the particles are detached and discharged via the air flow that passes the MEMS membrane (=media exchange).

The reset process may be carried out reliably and effectively by switching several times, e.g. 10 times, in order to effectively remove the adhering particles from the MEMS membrane.

According to embodiments, the membrane structure 110 provides a bi-stable state, wherein resonance modes may be excited in one of both states. By exciting different modes (natural resonances) of the MEMS membrane 110, a reliable determination of the quantity of adhering particles may be performed (=dependency of natural frequency).

For example, the shape of the electrodes 126, 128 for driving the piezoelectric functional layer (piezo layer) 127 may cover an entire surface or have an adapted shape (segmentation), wherein a defined interconnection of the segmented electrode portions may be used for efficient excitation of special modes of the MEMS membrane 110.

The particle sensor having the MEMS membrane 110 may also be formed in an array.

The top layer 130 to which the particles are to adhere may be specially configured to, on the one hand, ensure adhesion of the fine dust particles present in the surrounding atmosphere flowing past, and to further ensure adhesion during resonance mode, and to further ensure detachment during the switching process based on the bi-stable state of the MEMS membrane 110.

Additional embodiments and aspects are described which may be used alone or in combination with the features and functionalities described herein.

According to an aspect, a sensor element comprises: a membrane structure suspended on a frame structure, wherein the membrane structure comprises a membrane element and an actuator, wherein the membrane structure is deflectable in a first stable deflection state (=position) and in a second stable deflection state (=position) and is operable in a resonance mode in at least one of the first and the second stable deflection states, and wherein the actuator is configured to deflect the membrane structure in a first actuation state into one of the first and the second stable deflection states, and to operate the membrane structure in a second actuation state in a resonance mode having an associated resonance frequency.

According to a further aspect, the actuator comprises an actuator layer stack mechanically coupled to the membrane element, wherein the actuator layer stack comprises a piezoelectric functional layer in a sandwiched configuration between a first and second electrode structure.

According to a further aspect, at least one layer of the actuator layer stack or the membrane element is configured to exert a mechanical stress to the membrane structure for providing a buckling of the membrane structure.

According to a further aspect, the sensor element further comprises: an adhesive functional layer on at least one of the two main surface regions of the membrane structure for providing a defined adhesive effect to particulate matter in the environmental atmosphere of the membrane structure.

According to a further aspect, the adhesive functional layer is at least partially micro- or nano-structured to comprise a micro- and/or nano-structure.

According to a further aspect, the sensor element further comprises a heating element arranged for changing a temperature in a particle sensitive area.

According to an aspect, a particle sensor device comprises: the sensor element and a controller configured to provide the actuator in the first actuation state with a first actuation signal and in the second actuation state with a second actuation signal, and to detect a shift of the resonance frequency of the membrane structure based on particles adhering to the membrane structure.

According to a further aspect, the controller is configured to measure the impedance of the actuator, wherein the impedance of the actuator depends on the resonance frequency of the membrane structure.

According to a further aspect, the controller is configured to provide an output signal having an information on the amount of particulate matter adhering to the membrane structure based on the impedance of the actuator.

According to a further aspect, the controller is configured to operate the membrane structure based on the second actuation signal in one of a plurality of different resonance modes each having an associated resonance frequency of the membrane structure, and wherein the controller is further configured to measure the frequency dependent impedance of the actuator at the different resonance modes of the membrane structure.

According to a further aspect, the controller is further configured to measure the frequency dependent impedances at different resonance modes of the membrane structure and to provide an output signal having an information on an amount and/or a position of particles adhered to the deflectable portion of the membrane structure based on the different frequency dependent impedances of the resonance modes of the membrane structure.

According to a further aspect, at least one of the first and second electrode structures is segmented into at least two electrically separated electrode structure segments allowing for a mode selective excitation of different resonance modes of the membrane structure.

According to a further aspect, the controller is configured to individually provide the electrode structure segments of the actuator with the first actuation signal and the second actuation signal or with different signal variations of the first actuation signal and of the second actuation signal.

According to a further aspect, the controller is configured to operate the membrane structure in a self-cleaning state by switching the membrane structure between the first and the second stable deflection states.

According to a further aspect, the controller is configured to conduct, on an alternating basis, a switching operation of the membrane structure between the two stable deflection states and to measure the frequency dependent impedance of the actuator.

According to a further aspect, the controller is further configured to provide the heating element with a third actuation signal to increase the temperature in the particle sensitive area of the sensor element;

wherein the controller is further configured to derive an information on the size and/or the amount of the particles detached from the deflectable portion of the membrane structure during the switching operation based on the impedance change of the actuator between the switched two stable deflection states.

According to a further aspect, wherein the controller is further configured to adjust the switching operation by setting the number of switching states of the membrane structure and/or by adjusting the inertial forces on the particulate matter adhered to the membrane structure during the switching state of the membrane structure.

According to an aspect, a method for detecting a particulate matter density in the ambient atmosphere with the sensor element comprises the steps of: providing the actuator in the first actuation state with a first actuation signal and in the second actuation state with a second actuation signal, detecting a shift of the resonance frequency of the membrane structure based on the amount of particles adhering to at least one of the main surface regions of the membrane structure, and providing an output signal having an information on the amount of particulate matter adhering to the deflectable portion of the membrane structure based on the frequency dependent impedance of the actuator.

According to a further aspect, the method further comprises: operating the membrane structure in a self-cleaning state by switching the membrane structure between the first and the second stable deflection state.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Moreover, some aspects of the controller 210 have been described in the context of an apparatus, it is clear that these aspects also represent a description of the corresponding method. The operation of the controller 210 may be executed by (or using) a hardware apparatus, like for example, a microprocessor, a programmable computer or an electronic circuit. In some embodiments, one or more of the most important method or operation steps may be executed by such an apparatus.

Depending on certain implementation requirements, embodiments of the controller 210 can be implemented in hardware or in software or at least partially in hardware or at least partially in software. In some embodiments, a programmable logic device (for example a field programmable gate array) may be used to perform some or all of the functionalities of the controller 210 described herein. In some embodiments, a field programmable gate array may cooperate with a microprocessor in order to perform one of the methods described herein. Generally, the methods are preferably performed by any hardware apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A sensor element comprising:
 a membrane structure suspended on a frame structure, wherein the membrane structure comprises a membrane element and an actuator,
 wherein the membrane structure is deflectable in a first stable deflection state and in a second stable deflection state and is operable in a resonance mode in at least one of the first and the second stable deflection states,
 wherein the membrane structure is coupled by a frame structure at a coupled location, wherein the membrane structure comprises a first portion that is above the coupled location in the first stable deflection state, and wherein the membrane structure comprises a second portion that is below the coupled location in the second stable deflection state,
 wherein the actuator is configured to deflect the membrane structure in a first actuation state into one of the first and the second stable deflection states, and to operate the membrane structure in a second actuation state in a resonance mode having an associated resonance frequency,
wherein the actuator comprises an actuator layer stack mechanically coupled to the membrane element, wherein the actuator layer stack comprises a piezoelectric functional layer in a sandwiched configuration between a first and second electrode structure,
wherein at least one of the first and second electrode structures is segmented into at least four electrically separated quadrant-shaped or wedge-shaped electrode structure segments, and
wherein the membrane structure is configured to operate in a self-cleaning state comprising switching the membrane structure between the first and the second stable deflection states.

2. The sensor element according to claim 1, wherein at least one layer of the actuator layer stack or the membrane element is configured to exert a mechanical stress to the membrane structure for providing a buckling of the membrane structure.

3. The sensor element according to claim 1, further comprising:
an adhesive functional layer on at least one of two main surface regions of the membrane structure for providing a defined adhesive effect to particulate matter in the environmental atmosphere of the membrane structure.

4. The sensor element according to claim 3, wherein the adhesive functional layer is at least partially micro- or nano-structured to comprise a micro- and/or nano-structure.

5. The sensor element according to claim 1, further comprising:
a heating element arranged for changing the temperature in a particle sensitive area.

6. A particle sensor device comprising:
the sensor element according to claim 1, and
a controller configured to provide the actuator in the first actuation state with a first actuation signal and in the second actuation state with a second actuation signal, and to detect a shift of the resonance frequency of the membrane structure based on particles adhering to the membrane structure.

7. The particle sensor device according to claim 6, wherein the controller is configured to measure a frequency dependent impedance of the actuator, wherein a frequency dependent impedance of the actuator depends on the resonance frequency of the membrane structure.

8. The particle sensor device according to claim 6, wherein the controller is configured to provide an output signal having an information on an amount of particulate matter adhering to the membrane structure based on an impedance of the actuator.

9. The particle sensor device according to claim 6, wherein the controller is configured to operate the membrane structure based on the second actuation signal in one of a plurality of different resonance modes each having an associated resonance frequency of the membrane structure, and wherein the controller is further configured to measure a frequency dependent impedance of the actuator at the different resonance modes of the membrane structure.

10. The particle sensor device according to claim 6, wherein the controller is further configured to measure frequency dependent impedances at different resonance modes of the membrane structure and to provide an output signal having an information on an amount and/or a position of particles adhered to a deflectable portion of the membrane structure based on the different frequency dependent impedances of the resonance modes of the membrane structure.

11. The particle sensor device according to claim 6, wherein at least one of the first and second electrode structures is configured for allowing for a mode selective excitation of different resonance modes of the membrane structure.

12. The particle sensor device according to claim 6, wherein the controller is configured to individually provide the electrode structure segments of the actuator with the first actuation signal and the second actuation signal or with different signal variations of the first actuation signal and of the second actuation signal.

13. The particle sensor device according to claim 6, wherein the controller is configured to operate the membrane structure in the self-cleaning state by switching the membrane structure between the first and the second stable deflection states.

14. The particle sensor device according to claim 13, wherein the controller is further configured to adjust the switching by setting a number of switching states of the membrane structure and/or by adjusting inertial forces on particulate matter adhered to the membrane structure during the switching state of the membrane structure.

15. The particle sensor device according to claim 14, wherein the controller is further configured to provide a heating element arranged for changing the temperature in a particle sensitive area with a third actuation signal to increase the temperature in the particle sensitive area of the sensor element.

16. The particle sensor device according to claim 6, wherein the controller is configured to conduct, on an alternating basis, a switching operation of the membrane structure between the first and second stable deflection states and to measure a frequency dependent impedance of the actuator, and
wherein the controller is further configured to derive an information on a size and/or an amount of the particles detached from a deflectable portion of the membrane structure during the switching operation based on an impedance change of the actuator between the switched first and second stable deflection states.

17. A method for detecting a particulate matter density in the ambient atmosphere with the sensor element according to claim 1, the method comprising:
providing the actuator in the first actuation state with a first actuation signal and in the second actuation state with a second actuation signal,
detecting a shift of the resonance frequency of the membrane structure based on an amount of particles adhering to at least one of main surface regions of the membrane structure, and
providing an output signal having an information on an amount of particulate matter adhering to a deflectable portion of the membrane structure based on a frequency dependent impedance of the actuator.

18. The method according to claim 17, further comprising:
operating the membrane structure in the self-cleaning state by switching the membrane structure between the first and the second stable deflection state.

19. The sensor element according to claim 1, wherein the at least four electrically separated quadrant-shaped or wedge-shaped electrode structure segments each comprise an outer electrode segment and an inner electrode segment.

20. The sensor element according to claim 19, wherein the outer electrode segment and the inner electrode segment are electrically separated by an annular gap.

\* \* \* \* \*